United States Patent
Lee et al.

(10) Patent No.: US 9,379,705 B2
(45) Date of Patent: Jun. 28, 2016

(54) INTEGRATED CIRCUIT AND SEMICONDUCTOR DEVICE INCLUDING THE SAME

(71) Applicant: SAMSUNG ELECTRONICS CO., LTD., Suwon-Si, Gyeonggi-Do (KR)

(72) Inventors: Dal-Hee Lee, Seoul (KR); Jae-Woo Seo, Seoul (KR); Min-Ho Park, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/624,646

(22) Filed: Feb. 18, 2015

(65) Prior Publication Data

US 2015/0244366 A1    Aug. 27, 2015

Related U.S. Application Data

(60) Provisional application No. 61/942,818, filed on Feb. 21, 2014.

(30) Foreign Application Priority Data

Aug. 27, 2014  (KR) .......................... 10-2014-0112331

(51) Int. Cl.
*H03K 19/00* (2006.01)
*H03K 19/0185* (2006.01)
*H03K 19/0944* (2006.01)
*G06F 17/50* (2006.01)

(52) U.S. Cl.
CPC ........ *H03K 19/0013* (2013.01); *G06F 17/5072* (2013.01); *H03K 19/018507* (2013.01); *H03K 19/0944* (2013.01)

(58) Field of Classification Search
CPC .................. H03K 19/0013; H03K 19/018507; H03K 19/0944; G06F 17/5072
See application file for complete search history.

(56) References Cited

U.S. PATENT DOCUMENTS

| | | | |
|---|---|---|---|
| 6,741,492 B2 | 5/2004 | Nii | |
| 6,868,001 B2 | 3/2005 | Nii | |
| 7,505,355 B2 | 3/2009 | Kanda et al. | |
| 7,768,853 B2 | 8/2010 | Ahn et al. | |
| 7,859,880 B2 | 12/2010 | Chun | |
| 8,054,710 B2 | 11/2011 | Ito et al. | |
| 8,188,544 B2 | 5/2012 | Kumagai et al. | |
| 8,310,478 B2 | 11/2012 | Kumagai et al. | |
| 8,487,681 B2 | 7/2013 | Dally et al. | |
| 8,547,722 B2 | 10/2013 | Ito et al. | |

(Continued)

FOREIGN PATENT DOCUMENTS

| | | |
|---|---|---|
| JP | 2003-060089 | 2/2003 |
| JP | 2003-273250 | 9/2003 |

(Continued)

*Primary Examiner* — Jany Richardson
(74) *Attorney, Agent, or Firm* — F. Chau & Associates, LLC

(57) ABSTRACT

An integrated circuit (IC) includes at least one unit cell. The at least one unit cell includes a first bit circuit configured to process a first bit signal, a second bit circuit configured to process a second bit signal, a first well spaced apart from boundaries of the at least one unit cell and biased to a first voltage, and a second well biased to a second voltage that is different from the first voltage. Each of the first and second bit circuits includes at least one transistor from among a plurality of transistors disposed in the first well.

19 Claims, 17 Drawing Sheets

(56) References Cited

U.S. PATENT DOCUMENTS

| | | |
|---|---|---|
| 8,547,773 B2 | 10/2013 | Saiki et al. |
| 8,638,618 B2 | 1/2014 | Hung et al. |
| 2011/0090203 A1 | 4/2011 | Cho |
| 2011/0254588 A1 | 10/2011 | Nacer et al. |
| 2013/0015882 A1* | 1/2013 | Datta ............ H03K 19/018521 326/80 |

FOREIGN PATENT DOCUMENTS

| | | |
|---|---|---|
| JP | 2006-114139 | 4/2006 |
| JP | 2011-119753 | 6/2011 |
| KR | 100873623 | 12/2008 |
| KR | 1020080105867 | 12/2008 |
| KR | 101357847 | 1/2014 |

* cited by examiner

INTEGRATED CIRCUIT AND SEMICONDUCTOR DEVICE INCLUDING THE SAME

CROSS-REFERENCE TO RELATED APPLICATIONS

This application claims the benefit of U.S. Provisional Patent Application No. 61/942,818, filed on Feb. 21, 2014, and Korean Patent Application No. 10-2014-0112331, filed on Aug. 27, 2014, the disclosures of which are incorporated by reference herein in their entirety.

TECHNICAL FIELD

Exemplary embodiments of the inventive concept relate to an integrated circuit (IC) and a semiconductor device including the same, and more particularly, to an IC for processing multi-bit signals.

DISCUSSION OF THE RELATED ART

As semiconductor processing technology improves, the size of transistors has been reduced. As a result, more transistors are capable of being integrated into a semiconductor device. For example, a system-on-chip (SoC), which is an IC that integrates all components of a computer or another electronic system into a single chip, is widely used for various applications. As application performance improves, there is a demand for a semiconductor including an increased number of components.

Various approaches have been taken in an effort to reduce power consumed by a semiconductor device that is used in an application such as, for example, a portable electronic device. For example, in order to reduce power consumed by a semiconductor device, components that are included in the semiconductor device may be driven using a plurality of power supply voltages, and the power supplied to components that are not being used may be cut off while the components are not in use.

SUMMARY

Exemplary embodiments of the inventive concept provide an integrated circuit (IC) and a semiconductor device including the same, and more particularly, an IC for processing multi-bit signals that may have a reduced area occupied by components of the IC and reduced power consumption, a semiconductor device including the IC, and a method of generating a layout of the IC.

According to an exemplary embodiment of the inventive concept, an IC includes at least one unit cell, and the at least one unit cell includes first and second bit circuits that are configured to respectively process first and second bit signals, a first well that is biased to a first voltage and is disposed to be spaced apart from boundaries of the unit cell, and a second well that is biased to a second voltage that is different from the first voltage. Each of the first and second bit circuits includes at least one transistor from among transistors that are disposed in the first well.

In an exemplary embodiment, the first and second bit circuits may have a same configuration.

In an exemplary embodiment, a layout of the first bit circuit and a layout of the second bit circuit may be symmetrical to each other about an axis that crosses the unit cell.

In an exemplary embodiment, a layout of the first bit circuit may be the same as a layout obtained by rotating a layout of the second bit circuit about a point in the unit cell.

In an exemplary embodiment, each of the first and second bit circuits may include a level shifter.

In an exemplary embodiment, each unit cell may further include a third well that is biased to the second voltage. The second and third wells respectively contact opposing sides from one pair of sides that face each other from among the boundaries of the unit cell.

In an exemplary embodiment, the first well may be disposed to be spaced apart from the second and third wells by a distance or more according to a well-to-well space rule.

In an exemplary embodiment, the first bit circuit may include at least one transistor that is disposed in the second well, and the second bit circuit may include at least one transistor that is disposed in the third well.

In an exemplary embodiment, a length of the unit cell in a first direction may be equal to an integer number multiplied by a length of a standard cell in the first direction based on a semiconductor process of manufacturing the IC. The one pair of sides are parallel to the first direction.

In an exemplary embodiment, areas of the second and third wells may be determined based on a well proximity effect that occurs in other unit cells that contact the one pair of sides.

In an exemplary embodiment, the unit cell may further include third and fourth bit circuits for respectively processing third and fourth bit signals. Layouts of the first through fourth bit circuits may be disposed adjacent to one another to form the unit cell. Each of the third and fourth bit circuits may include at least one transistor from among the transistors that are disposed in the first well.

In an exemplary embodiment, the third bit circuit may include at least one transistor that is disposed in the second well, and the fourth bit circuit may include at least one transistor that is disposed in the third well.

In an exemplary embodiment, layouts of the first through fourth bit circuits may be respectively disposed in four quadrants of the unit cell. The unit cell may further include a common circuit that is configured to receive a control signal and control the first and second bit circuits according to the control signal.

In an exemplary embodiment, the common circuit may include a transistor that cuts off, according to the control signal, a current that flows due to the first voltage or the second voltage to ground through at least one transistor that is included in each of the first and second bit circuits.

In an exemplary embodiment, the unit cell may include first and second sub-cells, each of which includes a plurality of bit circuits including the first and second bit circuits. Each of the first and second sub-cells includes at least one transistor from among the transistors that are disposed in the first well.

In an exemplary embodiment, the unit cell may include third and fourth sub-cells that have the same configurations as configurations of the first and second sub-cells. Each of the third and fourth sub-cells includes at least one transistor from among the transistors that are disposed in the first well.

In an exemplary embodiment, layouts of the first through fourth sub-cells may be respectively disposed in four quadrants of the unit cell.

According to an exemplary embodiment of the inventive concept, an IC includes at least one unit cell, and the at least one unit cell includes first and second bit circuits that are configured to respectively process first and second bit signals, and a common circuit that is configured to receive a control signal and control the first and second bit circuits according to the control signal.

In an exemplary embodiment, the first bit circuit may include a logic gate that receives the first bit signal and a signal that is output from the common circuit, and the second bit circuit may include a logic gate that receives the second bit signal and a signal that is output from the common circuit. The logic gates that are respectively included in the first and second bit circuits are of the same type.

In an exemplary embodiment, the first bit circuit may include a latch that receives the first bit signal, and the second bit circuit includes a latch that receives the second bit signal. The latches that are respectively included in the first and second bit circuits respectively latch the first and second bit signals according to a signal that is output from the common circuit.

In an exemplary embodiment, the first bit circuit includes a flip-flop that receives the first bit signal, and the second bit circuit includes a flip-flop that receives the second bit signal. The flip-flops that are respectively included in the first and second bit circuits receive a clock signal from the outside of the unit cell and retain signals that are output from the flip-flops according to a signal that is output from the common circuit.

In an exemplary embodiment, each unit cell may be included in a first block to which a first voltage is selectively applied according to the control signal and receives a second voltage from the outside of the first block.

In an exemplary embodiment, signals that are output from the first and second bit circuits may be transmitted to a second block to which the second voltage is applied.

According to an exemplary embodiment of the inventive concept, a method of generating a layout of an IC includes receiving a netlist of the IC including a plurality of bit circuits, each of which is configured to process a single-bit signal and corresponds to a first unit cell, and disposing, in a layout of the IC, a second unit cell corresponding to two or more bit circuits. The plurality of bit circuits that are included in the IC are configured to simultaneously process single-bit signals that are included in a multi-bit signal.

In an exemplary embodiment, the second unit cell may include a first well that is biased to a first voltage and is disposed to be spaced apart from boundaries of the second unit cell, and a second well that is biased to a second voltage that is different from the first voltage. Each of the two or more bit circuits includes at least one transistor from among transistors that are disposed in the first well.

In an exemplary embodiment, the second unit cell may include a layout corresponding to a common circuit that is configured to receive a control signal and control the two or more bit signals according to the control signal.

In an exemplary embodiment, the common circuit may include a transistor that cuts off, according to the control signal, a current that flows due to a first voltage or a second voltage to ground through at least one transistor that is included in each of the two or more bit circuits.

In an exemplary embodiment, disposing the second unit cell in the layout of the IC may include generating the second unit cell based on the two or more bit circuits, and disposing the second unit cell.

In an exemplary embodiment, generating the second unit cell may include generating a first layout corresponding to the bit circuit, generating a second layout that is symmetrical to the first layout and/or is the same as a layout obtained by rotating the first layout, and disposing the first and second layouts such that the first and second layouts are adjacent to each other.

In an exemplary embodiment, generating the second unit cell may include identifying common transistors that are respectively included in the two or more bit circuits and are controlled by a control signal that is commonly received by the two or more bit circuits, adding a common circuit including at least one transistor from among the common transistors to the netlist, removing the at least one transistor from each of the two or more bit circuits in the netlist, and generating the second unit cell based on the netlist.

In an exemplary embodiment, disposing the second unit cell in the layout of the IC may include searching for the second unit cell in a cell library to obtain the second unit cell, and disposing the obtained second unit cell.

According to an exemplary embodiment of the inventive concept, a non-transitory computer-readable storage medium includes a plurality of instructions for performing the method described above embodied thereon.

According to an exemplary embodiment of the inventive concept, a computer system includes a processor and a non-transitory computer-readable storage medium having embodied thereon a plurality of instructions executable by the processor for performing the method described above.

According to an exemplary embodiment of the inventive concept, an IC includes at least one unit cell, and the at least one unit cell includes a first bit circuit configured to process a first bit signal, a second bit circuit configured to process a second bit signal, a first well spaced apart from boundaries of the at least one unit cell and biased to a first voltage, a second well biased to a second voltage that is different from the first voltage, a third well biased to the second voltage, and a common circuit configured to receive a control signal and control the first and second bit circuits according to the control signal. Each of the first and second bit circuits includes at least one transistor from among a plurality of transistors disposed in the first well. The second and third wells each contact one side from a pair of sides of the at least one unit cell that face each other, and the pair of sides corresponds to the boundaries of the at least one unit cell. The common circuit is disposed at the one side from the pair of sides contacted by the second well, and a portion of the second well is disposed in a same area as the common circuit.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1A:
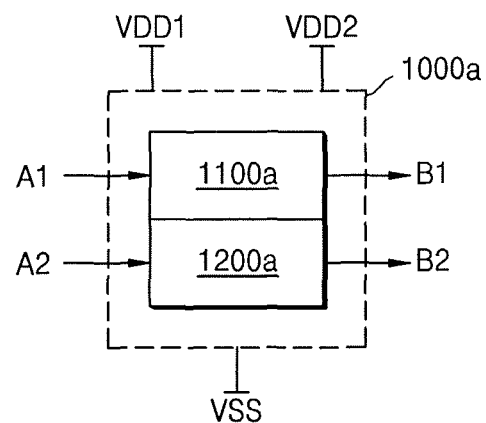
FIGS. 1A and 1B are respectively a block diagram and a layout view of an integrated circuit (IC) for processing multi-bit signals, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that when an element or layer is referred to as being "on", "connected to", "coupled to", or "adjacent to" another element or layer, it can be directly on, connected, coupled, or adjacent to the other element or layer, or intervening elements or layers may be present. It will also be understood that when an element or layer is referred to as being "between" two elements or layers, it can be the only element or layer between the two elements or layers, or one or more intervening elements or layers may also be present. It will further be understood that the terms "first," "second," "third," etc. are used herein to distinguish one element from another, and the elements are not limited by these terms. Thus, a "first" element in an exemplary embodiment may be described as a "second" element in another exemplary embodiment. In the drawings, the thickness and length of films, panels, regions, etc. may be exaggerated for clarity.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art. Further, it is to be understood that while parameters may be described herein as having "about" a certain value, according to exemplary embodiments, the parameter may be exactly the certain value or approximately the certain value.

Exemplary embodiments of the present inventive concept provide an integrated circuit (IC) that may process a digital signal, an analog signal, or a combination of a digital signal and an analog signal. Examples of an IC for processing a digital signal may include a processor, a memory controller, a hardware encoder, a hardware decoder, and an interface block. The IC for processing a digital signal may process a digital signal based on a voltage of a digital signal line (e.g., based on a low-voltage state or a high-voltage state). One signal line may correspond to one bit data and digital data may include one or more bit data.

Exemplary embodiments of the present inventive concept provide an IC that may process a digital signal in units of digital data including predetermined number bit data. For example, a processor may process a digital signal in units of 16-bit data, 32-bit data, or 64-bit data. Digital signals corresponding to bit data that is included in digital data may be simultaneously processed as a result of, for example, the IC including a plurality of circuits having the same function.

Exemplary embodiments of the present inventive concept provide an IC for processing digital signals that may be disposed on a substrate to include a plurality of unit cells. One of the plurality of unit cells may correspond to a specific circuit that is included in the IC and may include a layout of the specific circuit. A semiconductor design tool may provide a standard cell according to a semiconductor process of manufacturing the IC, and the standard cell may have a preset height in order to improve disposition efficiency.

Figure 1B:
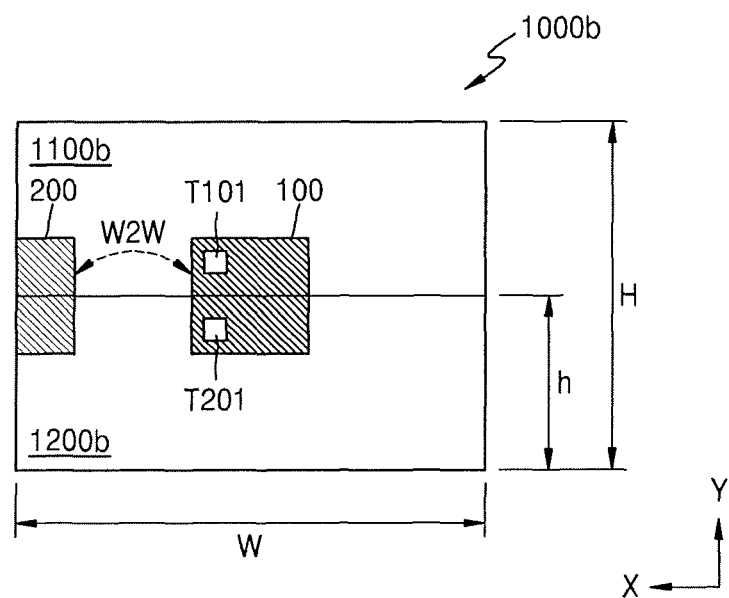

FIGS. 1A and 1B are respectively a block diagram and a layout view of an integrated circuit (IC) 1000a for processing multi-bit signals, according to an exemplary embodiment of the inventive concept. In FIGS. 1A and 1B through FIGS. 7A and 7B, a reference numeral including 'a' corresponds to an element in a block diagram of a circuit and a reference numeral including 'b' corresponds to an element in a layout view of the circuit.

Referring to FIG. 1A, the IC 1000a may include a first bit circuit 1100a and a second bit circuit 1200a. A bit circuit may be defined as a circuit that processes a single bit signal. The first bit circuit 1100a may receive a first bit signal A1, process the first bit signal A1, and generate and output a first output signal B1. Similarly, the second bit circuit 1200a may receive a second bit signal A2, process the second bit signal A2, and generate and output a second output signal B2. Each of the first and second bit circuits 1100a and 1200a may include, for example, a plurality of transistors, and each of the first and second bit signals A1 and A2 may be applied to at least one transistor from among the plurality of transistors.

According to an exemplary embodiment of the inventive concept, the first bit circuit 1100a and the second bit circuit 1200a may have the same configuration as each other. That is, the first and second bit circuits 1100a and 1200a may respectively process the first bit signal A1 and the second bit signal A2 in the same manner. For example, herein, circuit diagrams of the first bit circuit 1100a and the second bit circuit 1200a may be the same, although signals (e.g., the first bit signal A1 and the second bit signal A2) that are input from the outside of the IC 1000a are different from each other and signals (e.g., the first output signal B1 and the second output signal B2) that are output to the outside of the IC 1000a are differently named.

Although each of the first bit circuit 1100a and the second bit circuit 1200a is shown as outputting only one signal in FIG. 1A, exemplary embodiments of the inventive concept are not limited thereto. For example, the first bit circuit 1100a and the second bit circuit 1200*a* may respectively process the first bit signal A1 and the second bit signal A2, and may each generate two or more bit signals (for example, a 1-bit output signal and an inverted signal thereof).

The IC 1000*a* according to an exemplary embodiment of the inventive concept may receive a plurality of power supply voltages. Each of the first bit circuit 1100*a* and the second bit circuit 1200*a* may include, for example, a level shifter that shifts a voltage level of an input signal. In an exemplary embodiment, the level shifter may shift a voltage level of a bit signal having a low-voltage state and a high-voltage state between about 0 V and about 1.8 V to a voltage level of a bit signal having a low-voltage state and a high-voltage state between about 0 V and about 3.3 V. It is to be understood that these values are exemplary, and the level shifter is not limited thereto. In addition to being used to transmit a signal between semiconductor devices that are driven at different power supply voltages or to receive a signal received from the outside of a semiconductor device into the semiconductor device, the level shifter may also be used to transmit a signal between blocks that are driven at different power supply voltages in a semiconductor device.

Figure 5:
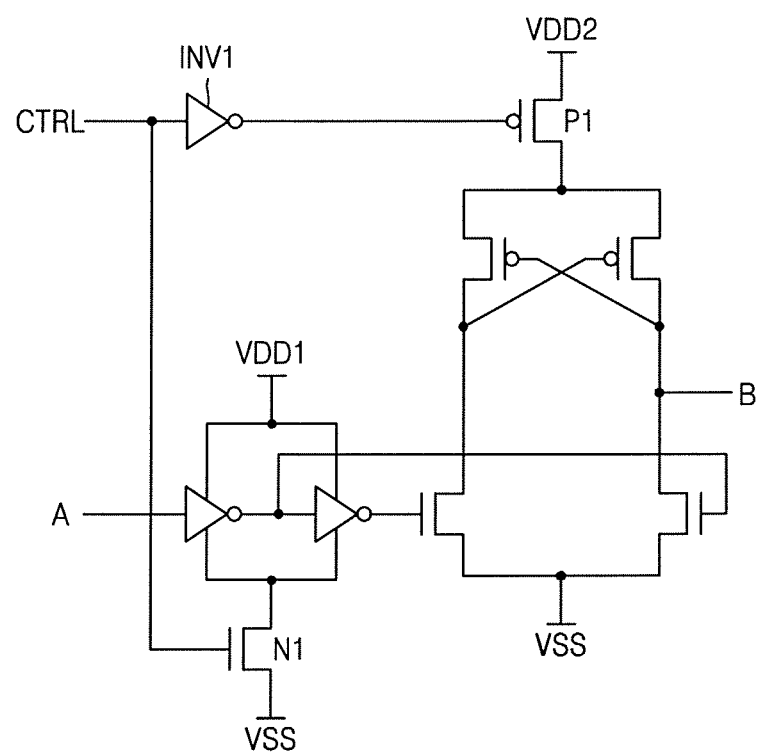
FIG. 5 is a circuit diagram illustrating a circuit for processing a 1-bit signal, according to an exemplary embodiment of the inventive concept.

For example, the level shifter may receive a power supply voltage of circuits in which an input signal is to be generated and a power supply voltage of circuits to which an output signal is to be transmitted. FIG. 5 is a circuit diagram illustrating a level shifter 50 according to an exemplary embodiment of the inventive concept. Referring to FIG. 5, the level shifter 50 may include two inverters that receive current due to a first voltage VDD1, and a plurality of transistors that receive current due to a second voltage VDD2. In FIG. 5, the first voltage VDD1 may correspond to a power supply voltage of circuits that transmit the first bit signal A1 to the first bit circuit 1100*a*, and the second voltage VDD2 may correspond to a power supply voltage of circuits that receive the first output signal B1 that is output from the first bit circuit 1100*a*.

As shown in FIG. 1A, the IC 1000*a* may receive the first voltage VDD1 and the second voltage VDD2. Current may flow due to the first voltage VDD1 and/or the second voltage VDD2 through the IC 1000*a* to ground (e.g., ground voltage) VSS. For example, some of the plurality of transistors that is included in the first bit circuit 1100*a* may receive current due to the first voltage VDD1 and the others may receive current due to the second voltage VDD2. When the IC 1000*a* that receives a plurality of power supply voltages is disposed on the substrate, additional space on the IC 1000*a* may be needed as the result of an increased number of components on the IC 1000*a*. Exemplary embodiments of the present inventive concept may reduce this additional needed space, for example, when many bit signals are input to the IC 1000*a* (e.g., when the number of bits of digital data to be processed is large).

FIG. 1B is a layout view illustrating the IC 1000*a* of FIG. 1A that is disposed on the substrate. As shown in FIG. 1B, the IC 1000*a* may include a layout (hereinafter referred to as a first layout 1100*b*) of the first bit circuit 1100*a* and a layout (hereinafter referred to as a second layout 1200*b*) of the second bit circuit 1200*a*. The first layout 1100*b* and the second layout 1200*b* may be disposed adjacent to each other to form one unit cell 1000*b*. As shown in FIG. 1B, the unit cell 1000*b* may have a length W in an X-axis direction and a length H in a Y-axis direction. According to an exemplary embodiment of the inventive concept, the ability to dispose a standard cell or another unit cell adjacent to the unit cell 1000*b* may be improved by defining the length H to be about equal to an integer number multiplied by a height h of the standard cell. For example, as shown in FIG. 1B, the unit cell 1000*b* may be about 2 times the height h of the standard cell.

As described with reference to FIG. 1A, the transistors that are included in the first bit circuit 1100*a* and the second bit circuit 1200*a* may be respectively disposed in the first layout 1100*b* and the second layout 1200*b*. According to exemplary embodiments of the inventive concept, the first layout 1100*b* may be the same as that obtained by rotating the second layout 1200*b* about one point of the unit cell 1000*b* by 180°, or the first layout 1100*b* and the second layout 1200*b* may be symmetrical to each other about an axis that is parallel to the X-axis and crosses the unit cell 1000*b*.

As shown in FIG. 1B, the unit cell 1000*b* may include a first well 100 and a second well 200. The term well refers to a region on which a transistor is to be disposed and that has a dopant type different from that of the substrate. For example, when the substrate is a P-type substrate, the first well 100 and the second well 200 of FIG. 1B may be N-type wells that are formed on the substrate. When the first well 100 and the second well 200 are N-type wells, a P-channel metal-oxide semiconductor field-effect transistor (MOSFET) from among the transistors that are included in the first layout 1100*b* and the second layout 1200*b* may be disposed in the first well 100 or the second well 200. For convenience of description, exemplary embodiments in which each well is an N-type well that is formed on a P-type substrate are described herein, however, exemplary embodiments are not limited thereto. For example, according to an exemplary embodiment of the inventive concept, each well may be a P-type well that is formed on an N-type substrate, and an N-channel MOSFET may be disposed in each well.

As described with reference to FIG. 1A, the unit cell 1000*b* including the layout of the IC 1000*a* may receive a plurality of power supply voltages (e.g., the first voltage VDD1 and the second voltage VDD2). According to an exemplary embodiment of the inventive concept, the first well 100 may be biased to the first voltage VDD1 and the second well 200 may be biased to the second voltage VDD2. For example, when each of the first bit circuit 1100*a* and the second bit circuit 1200*a* includes the level shifter 50 of FIG. 5, P-channel MOSFETS that are included in the two inverters that receive current due to the first voltage VDD1 may be disposed in the first well 100, and three P-channel MOSFETs that receive current due to the second voltage VDD2 may be disposed in the second well 200.

The IC 1000*a* may be disposed on the substrate according to certain design rules. That is, the unit cell 1000*b* may satisfy certain design rules. For example, certain design rules may specify that, for example, minimum sizes of features that are disposed on the substrate and distances between the features have values that depend on characteristics of a semiconductor process. According to exemplary embodiments, the features of the unit cell 1000*b* may be disposed in a manner that satisfies the values of the design rules (e.g., features may be disposed to be spaced apart from each other by the values specified in the design rules).

The design rules may include, for example, a well-to-well spacing rule. The well-to-well spacing rule may define a minimum distance between wells of the same type and a distance between wells of different types. As shown in FIG. 1B, in an exemplary embodiment, the first well 100 and the second well 200 of the unit cell 1000*b* may be disposed to satisfy a distance W2W according to the well-to-well spacing rule. For example, the first well 100 and the second well 200 may be disposed to be spaced apart from each other by the distance W2W or more. The distance W2W may be determined based on interference between the first and second wells 100 and 200.

When other unit cells that are disposed around the unit cell 1000*b* receive the second voltage VDD2, the first well 100 that is biased to the first voltage VDD1 may be disposed to be spaced apart from boundaries of the unit cell 1000*b*. For example, each of the other unit cells that are disposed around the unit cell 1000*b* may include a well that is biased to the second voltage VDD2, and in order to satisfy the distance W2W between the well that is included in each of the other unit cells and the first well 100 that is biased to the first voltage VDD1 of the unit cell 1000*b*, the first well 100 may be disposed to be spaced apart from the boundaries of the unit cell 1000*b*. For example, in an exemplary embodiment, the first well 100 may be disposed such that a space exists between the first well 100 and at least two boundaries (e.g., at least two sides) of the unit cell 1000*b*. In an exemplary embodiment, the first well 100 may be disposed such that a space exists between the first well 100 and every boundary (e.g., every side) of the unit cell 1000*b*. For example, in an exemplary embodiment, the first well 100 may be disposed at or near a center area of the unit cell 1000*b* and does not contact any boundary (e.g., any side) of the unit cell 1000*b*.

According to an exemplary embodiment of the inventive concept, each of the first bit circuit 1100*a* and the second bit circuit 1200*a* may include at least one transistor from among the plurality of transistors that is disposed in the first well 100. For example, as shown in FIG. 1B, the first bit circuit 1100*a* may include a transistor T101 that is disposed in the first well 100 and the second bit circuit 1200*a* may include a transistor T201 that is disposed in the first well 100. For example, the first layout 1100*b* of the first bit circuit 1100*a* and the second layout 1200*b* of the second bit circuit 1200*a* may share the first well 100 that is biased to the first voltage VDD1.

When the first bit circuit 1100*a* and the second bit circuit 1200*a* of FIG. 1A have identical layouts on the substrate, the identical layouts may respectively include wells that are biased to the first voltage VDD1. In this case, since the wells that are respectively included in the identical layouts are disposed to be spaced apart by the distance W2W or more from boundaries of the identical layouts, an area larger than that of the unit cell 1000*b* of FIG. 1B may be utilized. For example, as shown in FIG. 1B, since the first layout 1100*b* and the second layout 1200*b* share the first well 100 that is biased to the first voltage VDD1, the first layout 1100*b* and the second layout 1200*b* may have reduced areas. An exemplary embodiment in which the first bit circuit 1100*a* and the second bit circuit 1200*a* of FIG. 1A have identical layouts on the substrate will now be described in detail with reference to FIGS. 2A and 2B.

Figure 2A:
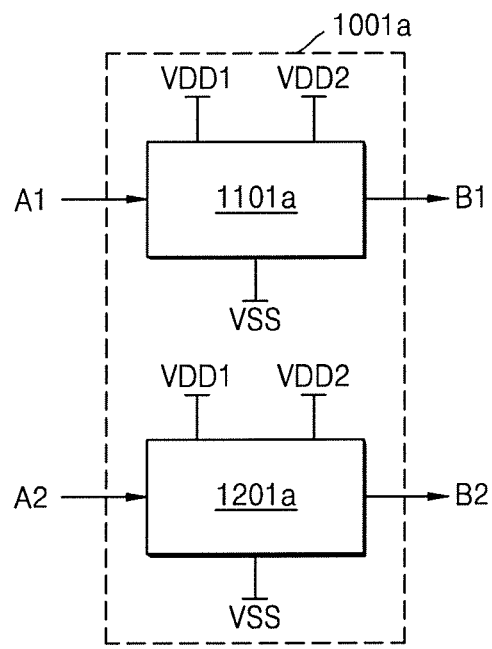
FIGS. 2A and 2B are respectively a block diagram and a layout view of an IC in which bit circuits for processing two bit signals are independently provided, according to an exemplary embodiment of the inventive concept.
Figure 2B:
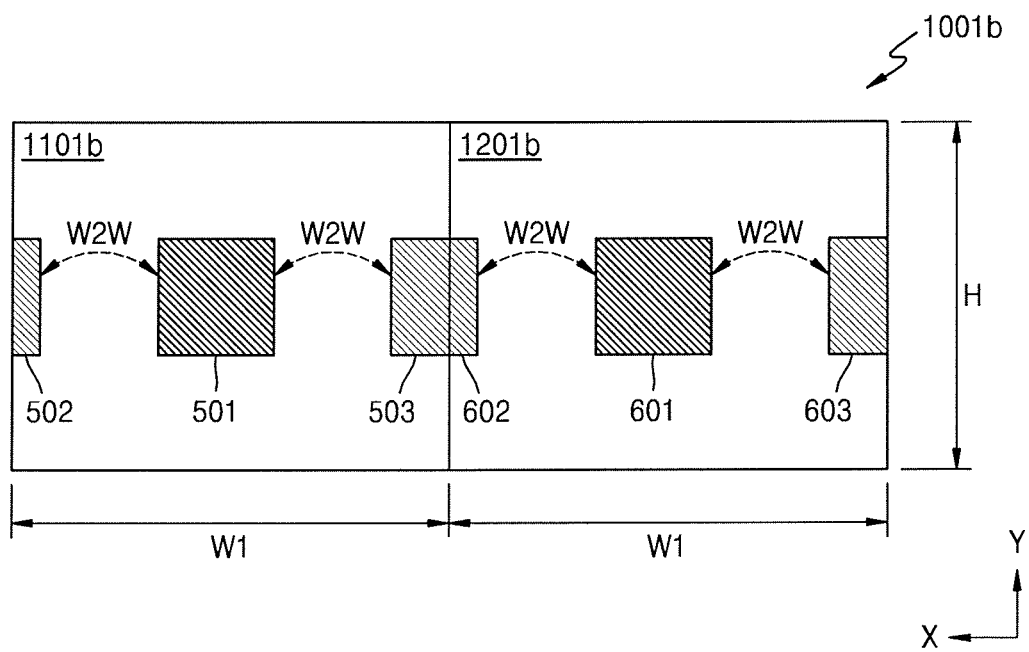

FIGS. 2A and 2B are respectively a block diagram and a layout view of an IC 1001*a* in which bit circuits for processing two bit signals are independently provided, according to an exemplary embodiment of the inventive concept. Referring to FIG. 1A, a first bit circuit 1101*a* may receive the first bit signal A1, process the first bit signal A1, and generate and output the first output signal B1. Similarly, a second bit circuit 1201*a* may receive the second bit signal A2, process the second bit signal A2, and generate and output the second output signal B2. Unlike the unit cell 1000*b* of FIG. 1B, however, the first and second bit circuits 1101*a* and 1201*a* that are included in an IC 1001*a* of FIG. 2A may have identical layouts, and as shown in FIG. 2A, may independently respectively receive the first voltage VDD1 and the second voltage VDD2.

FIG. 2B is a layout view illustrating the IC 1001*a* of FIG. 2A that is disposed on the substrate. As shown in FIG. 2B, the IC 1001*a* may include a layout (hereinafter referred to as a first layout 1101*b*) of the first bit circuit 1101*a* and a layout (hereinafter referred to as a second layout 1201*b*) of the second bit circuit 1201*a*. The first layout 1101*b* and the second layout 1201*b* may be disposed adjacent to each other to form one unit cell 1001*b*. Transistors that are included in the first bit circuit 1101*a* and the second bit circuit 1201*a* may be respectively disposed in the first layout 1101*b* and the second layout 1201*b*. In FIG. 2B, the first layout 1101*b* and the second layout 1201*b* may be to the same as each other. In FIG. 2B, since the first layout 1101*b* and the second layout 1201*b* are the same as each other, the second layout 1201*b* will not be separately described. As shown in FIG. 2B, the first and second layouts 1101*b* and 1201*b* may respectively have a length W1 in an X-axis direction and a length H in a Y-axis direction.

As shown in FIG. 2B, the first layout 1101*b* may include a first well 501 that is biased to the first voltage VDD1 and a second well 502 that is biased to the second voltage VDD2. As described with reference to FIG. 1B, the first well 501 may be disposed to be spaced apart from boundaries of the first layout 1101*b* (e.g., based on certain design rules). The first well 501 may be disposed to be spaced apart by the distance W2W or more from the second well 502. A P-type MOSFET that receives current due to the first voltage VDD1 from among the transistors that are disposed in the first layout 1101*b* may be disposed in the first well 501, and a P-type MOSFET that receives current due to the second voltage VDD2 may be disposed in the second well 502.

As shown in FIG. 2B, the first layout 1101*b* may further include a third well 503 that is biased to the second voltage VDD2. The third well 503 that is formed for a circuit (e.g., the standard cell or the second layout 1201*b*) that is disposed adjacent to the first layout 1101*b* may be formed in order to prevent a well proximity effect. For example, even when any of the transistors that are included in the first bit circuit 1101*a* are not disposed in the third well 503, the first layout 1101*b* may include the third well 503 to correspond to a well (e.g., a second well 602 from among a first well 601, a second well 602 and a third well 603 included in the second layout 1201*b* of FIG. 2B) that is included in a circuit that is disposed adjacent to a boundary on which the first well 503 is formed from among boundaries of the first layout 1101*b*.

As shown in FIG. 2B, the third well 503 that is included in the first layout 1101*b* may be disposed to be spaced apart by the distance W2W or more from the first well 501, and may have an area large enough to prevent a well proximity effect in the adjacent circuit. Accordingly, the first layout 1101*b* may include an area in which an element that is necessary to operate the first bit circuit 1101*a* is not disposed due to the third well 503 that is biased to the second voltage VDD2. The second layout 1201*b* may include an area in which an element that is necessary to operate the second layout 1201*b* is not disposed. According to exemplary embodiments, as the number of bit signals that are input to the IC 1001*a* increases, corresponding bit circuits increase, resulting in the increase in an overall area in which a transistor is not disposed in the unit cell 1001*b*.

Figure 3:
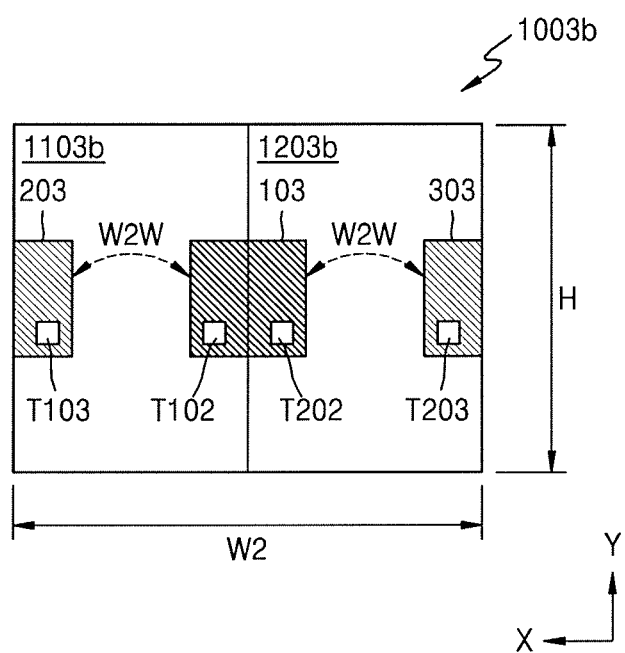
FIG. 3 is a layout view corresponding to the IC for processing multi-bit signals of FIG. 2A, according to an exemplary embodiment of the inventive concept.

FIG. 3 is a layout view corresponding to the IC 1001*a* for processing multi-bit signals of FIG. 2A, according to an exemplary embodiment of the inventive concept. Referring also to FIG. 2A, as shown in FIG. 3, a unit cell 1003*b* may include a layout (hereinafter referred to as a first layout 1103*b*) of the first bit circuit 1101*a* and a layout (hereinafter referred to as a second layout 1203*b*) of the second bit circuit 1201*a*. Transistors that are included in the first bit circuit 1101*a* and the second bit circuit 1201*a* may be respectively disposed in the first layout 1103*b* and the second layout 1203*b*. According to exemplary embodiments of the inventive concept, the first layout 1103b of the first bit circuit 1101a may be the same as that obtained by rotating the second layout 1203b of the second bit circuit 1201a about one point in the unit cell 1003b by 180°, or the first layout 1103b of the first bit circuit 1101a and the second layout 1203b of the second bit circuit 1201a may be symmetrical to each other about an axis that is parallel to the Y-axis and crosses the unit cell 1003b.

As shown in FIG. 3, the unit cell 1003b may include a first well 103 that is biased to the first voltage VDD1, and a second well 203 and a third well 303 that are biased to the second voltage VDD2. As shown in FIG. 3, the first well 103 may be disposed to be spaced apart from boundaries of the unit cell 1003b, and the second well 203 and the third well 303 may be disposed to respectively contact one side from a pair of sides that face each other in the X-axis direction from among the boundaries of the unit cell 1003b. The first well 103 may be disposed to be spaced apart by the distance W2W or more from the second well 203 and the third well 303.

According to an exemplary embodiment of the inventive concept, each of the first bit circuit 1101a and the second bit circuit 1201a may include at least one transistor from among the plurality of transistors that is disposed in the first well 103. For example, as shown in FIG. 3, the first bit circuit 1101a may include a transistor T102 that is disposed in the first well 103, and the second bit circuit 1201a may include a transistor T202 that is disposed in the first well 103. That is, the first layout 1103b of the first bit circuit 1101a and the second layout 1203b of the second bit circuit 1201a may share the first well 103, which is biased to the first voltage VDD1 instead of the second voltage VDD2 that is applied to circuits that are disposed adjacent to the unit cell 1003b.

According an exemplary embodiment of the inventive concept, the first bit circuit 1101a may include at least one transistor that is disposed in the second well 203, and the second bit circuit 1201a may include at least one transistor that is disposed in the third well 303. For example, as shown in FIG. 3, the first bit circuit 1101a may include a transistor T103 that is disposed in the second well 203, and the second bit circuit 1201a may include a transistor T203 that is disposed in the third well 303. For example, a P-type MOSFET that receives current due to the second voltage VDD2 from among the plurality transistors that is included in the first bit circuit 1101a may be disposed in the second well 203, and a P-type MOSFET that receives current due to the second voltage VDD2 from among the plurality of transistors that is included in the second bit circuit 1201a may be disposed in the third well 303.

In an exemplary embodiment, the unit cell 1001b of FIG. 2B includes the third well 503 of the first layout 1101b and the third well 603 of the second layout 1201b in which transistors are not disposed, whereas transistors may be disposed in the second well 203 and the third well 303 of the unit cell 1003b in an exemplary embodiment according to FIG. 3. Inclusion of the second well 203 and the third well 303 may allow transistors to be disposed therein and may prevent a well proximity effect in a circuit that is disposed adjacent to the unit cell 1003b. Accordingly, a length W2 of the unit cell 1003b of FIG. 3 in the X-axis direction may be less than a length W1+W1 of the unit cell 1001b of FIG. 2B in the X-axis direction. That is, according to an exemplary embodiment, the unit cell 1003b of FIG. 3 performs the same operation as that of the unit cell 1001b of FIG. 2B and may have an area less than that of the unit cell 1001b of FIG. 2B. For example, according to exemplary embodiments, when each of bit circuits that are disposed in the unit cells 1001b and 1003b includes a level shifter, an area occupied by a circuit for processing a single bit signal in the unit cell 1003b of FIG. 3 may be less than that in the unit cell 1001b of FIG. 2B. For example, according to exemplary embodiments, the area occupied by a circuit for processing a single bit signal in the unit cell 1003b of FIG. 3 may be about 41% to about 45% less than that in the unit cell 1001b of FIG. 2B.

Figure 4A:
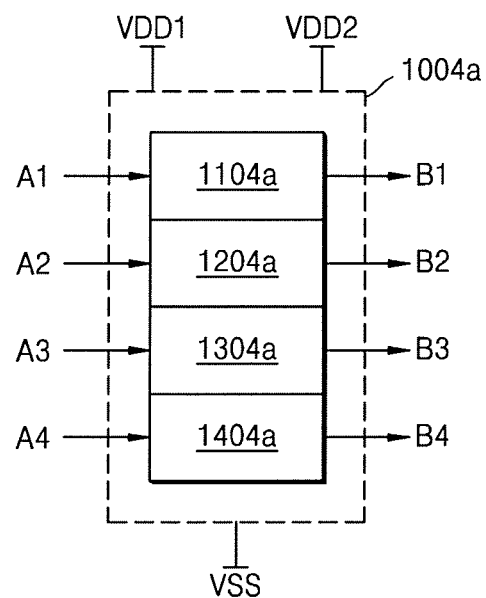
FIGS. 4A and 4B are respectively a block diagram and a layout view of an IC for processing multi-bit signals, according to an exemplary embodiment of the inventive concept.
Figure 4B:
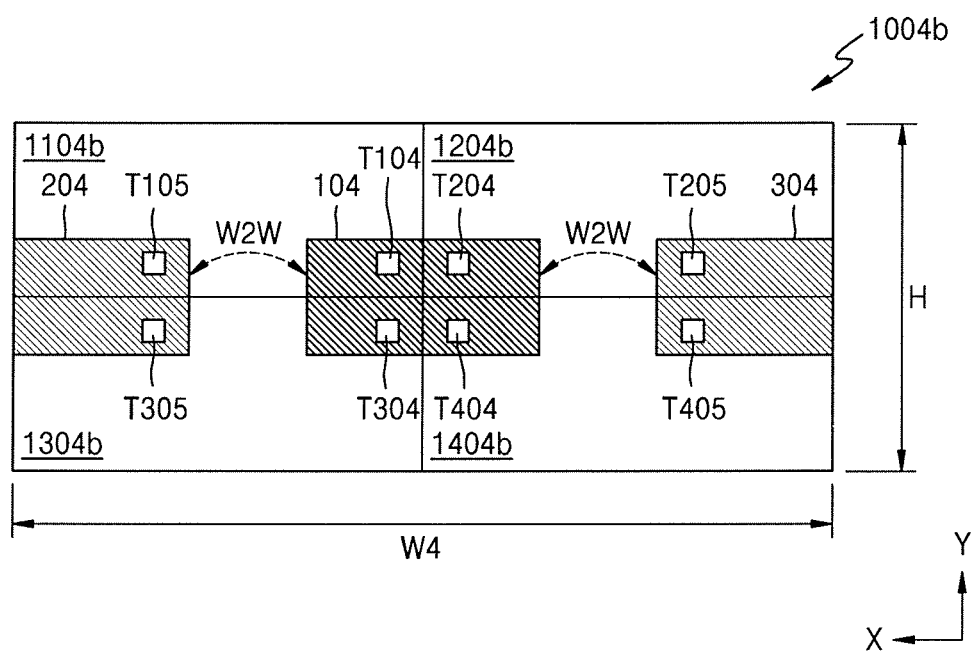

FIGS. 4A and 4B are respectively a block diagram and a layout view of an IC 1004a for processing multi-bit signals, according to an exemplary embodiment of the inventive concept. Referring to FIG. 4A, the IC 1004a may include a first bit circuit 1104a, a second bit circuit 1204a, a third bit circuit 1304a, and a fourth bit circuit 1404a. The first through fourth bit circuits 1104a, 1204a, 1304a, and 1404a may respectively receive first through fourth bit signals A1, A2, A3, and A4 and may respectively generate and output first through fourth output signals B1, B2, B3, and B4. The IC 1004a may receive the first voltage VDD1 and the second voltage VDD2.

FIG. 4B is a layout view illustrating the IC 1004a of FIG. 4A that is disposed on the substrate. As shown in FIG. 4B, a unit cell 1004b may include layouts (hereinafter referred to as a first layout 1104b, a second layout 1204b, a third layout 1304b, and a fourth layout 1404b) respectively corresponding to the first through fourth bit circuits 1104a, 1204a, 1304a, and 1404a. According to an exemplary embodiment of the inventive concept, as shown in FIG. 4B, the first through fourth layouts 1104b, 1204b, 1304b, and 1404b may be disposed in four quadrants of the unit cell 1004b. According to an exemplary embodiment of the inventive concept, the first layout 1104b of the first bit circuit 1104a and the second layout 1204b of the second bit circuit 1204a may be symmetrical to each other about an axis that is parallel to the Y-axis and crosses the unit cell 1004b, and the third layout 1304b of the third bit circuit 1304a and the fourth layout 1404b of the fourth bit circuit 1404a may be symmetrical to the first layout 1104b of the first bit circuit 1104a and the second layout 1204b of the second bit circuit 1204a about an axis that is parallel to the X-axis and crosses the unit cell 1004b.

As shown in FIG. 4B, the unit cell 1004b may include a first well 104 that is biased to the first voltage VDD1, and a second well 204 and a third well 304 that are biased to the second voltage VDD2. As shown in FIG. 4B, the first well 104 may be disposed to be spaced apart from boundaries of the unit cell 1004b, and the second well 204 and the third well 304 may be disposed to respectively contact a side from a pair of sides that face each other in the X-axis direction from among the boundaries of the unit cell 1004b. The first well 104 may be disposed to be spaced apart by the distance W2W or more from the second well 204 and the third well 304.

According to an exemplary embodiment of the inventive concept, each of the first through fourth bit circuits 1104a, 1204a, 1304a, and 1404a may include at least one transistor from among a plurality transistors that are disposed in the first well 104. For example, as shown in FIG. 4B, the first through fourth bit circuits 1104a, 1204a, 1304a, and 1404a may respectively include transistors T104, T204, T304, and T404 that are disposed in the first well 104. That is, the first through fourth layouts 1104b, 1204b, 1304b, and 1404b may share the first well 104 that is biased to the first voltage VDD1, instead of the second voltage VDD2 that is applied to circuits that are disposed adjacent to the unit 1004b.

According to an exemplary embodiment of the inventive concept, each of the first bit circuit 1104a and the third bit circuit 1304a may include at least one transistor from among the plurality of transistors that is disposed in the second well 204. In addition, each of the second bit circuit 1204a and the fourth bit circuit 1404a may include at least one transistor from among a plurality transistors that are disposed in the third well 304. For example, as shown in FIG. 4B, the first bit circuit 1104a and the third bit circuit 1304a may respectively include a transistor T105 and a transistor T305 that are disposed in the second well 204. In addition, the second bit circuit 1204a and the fourth bit circuit 1404a may respectively include a transistor T205 and a transistor T405 that are disposed in the third well 304. For example, a P-type MOSFET that receives current due to the second voltage VDD2 from among transistors that are included in the first bit circuit 1104a and the third bit circuit 1304a may be disposed in the second well 204, and a P-type MOSFET that receives current due to the second voltage VDD2 from among transistors that are included in the second bit circuit 1204a and the fourth bit circuit 1404a may be disposed in the third well 304.

The presence of the second well 204 and the third well 304 of the unit cell 1004b may allow for transistors to be disposed therein and may prevent a well proximity effect in a circuit that is disposed adjacent to the unit cell 1004b. In addition, the area occupied by components of the unit cell 1004b of FIG. 4B may be reduced by allowing the first well 104 that is biased to the first voltage VDD1 as well as the second well 204 and the third well 304 that are biased to the second voltage VDD2 to be shared by two layouts. Accordingly, a length W4 of the unit cell 1004b of FIG. 4B in the X-axis direction may be less than twice the length W2 of the unit cell 1003b of FIG. 3 in the X-axis direction. That is, an area of the unit cell 1004b of FIG. 4B may be smaller than twice the area of the unit cell 1003b of FIG. 3. For example, in an exemplary embodiment, when each of bit circuits that are included in the unit cell 1001b of FIG. 2B and the unit cell 1004b of FIG. 4B includes a level shifter, the area occupied by a circuit for processing a single bit signal in the unit cell 1004b of FIG. 4B is about 58% to about 62% less than that in the unit cell 1001b of FIG. 2B.

FIG. 5 is a circuit diagram illustrating a circuit for processing a 1-bit signal, according to an exemplary embodiment of the inventive concept. The circuit of FIG. 5 is a level shifter 50 that may receive a 1-bit signal A and may generate and output an output signal B by shifting a voltage level of the 1-bit signal A. As shown in FIG. 5, the level shifter 50 may include, for example, two inverters that receive current due to the first voltage VDD1 and five transistors that receive current due to the second voltage VDD2. The first voltage VDD1 may be a voltage that is applied to a circuit that generates the 1-bit signal A and the second voltage VDD2 may be a voltage that is applied to a circuit to which the output signal B is transmitted.

The level shifter 50 may receive a control signal CTRL for controlling the level shifter 50. For example, as shown in FIG. 5, the control signal CTRL may be used to cut off current that flows from the first voltage VDD1 and the second voltage VDD2 to the level shifter 50. For example, when the control signal CTRL is in a low-voltage state (e.g., when the control signal CTRL is a ground voltage), an N-channel MOSFET N1 may be turned off and a P-channel MOSFET P1 may also be turned off. Accordingly, current supply due to the first voltage VDD1 and the second voltage VDD2 to ground voltage VSS may be cut off and power consumed by the level shifter 50 may be reduced. That is, when the level shifter 50 is not used, the control signal CTRL may be a signal that is used to cut off power that is supplied to the level shifter 50.

Figure 6A:
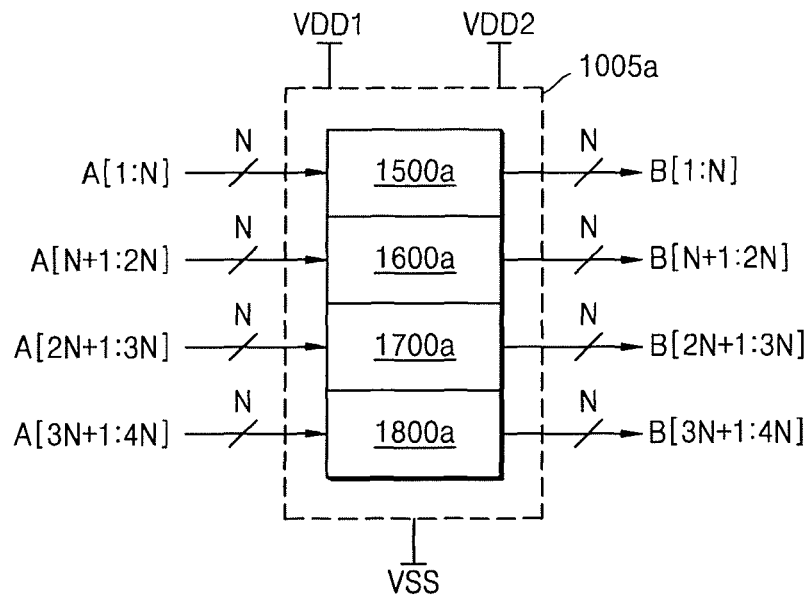
FIGS. 6A and 6B are respectively a block diagram and a layout view of an IC for processing multi-bit signals, according to an exemplary embodiment of the inventive concept.
Figure 6B:
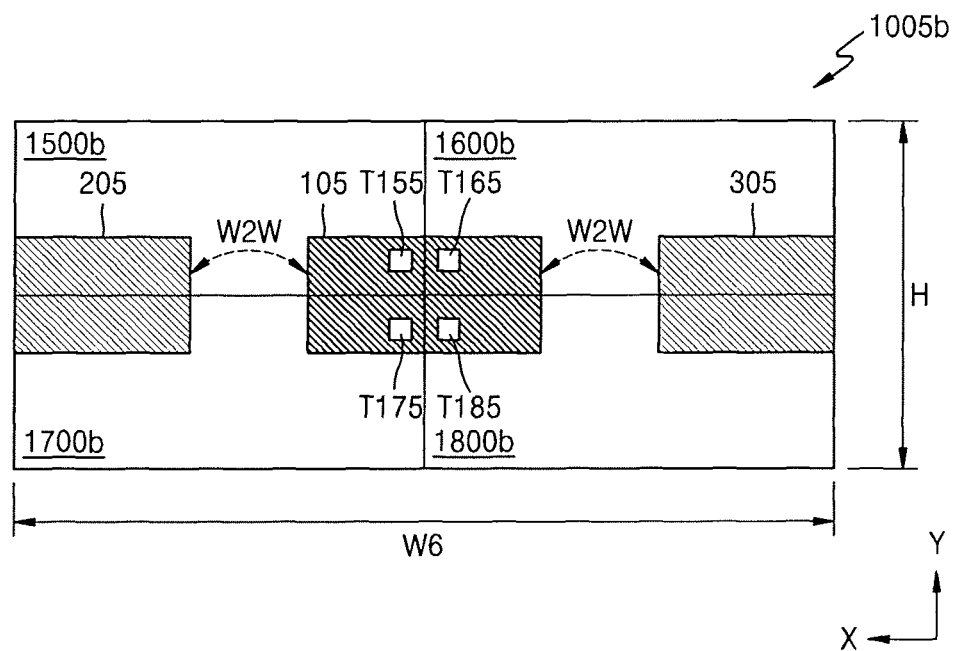

FIGS. 6A and 6B are respectively a block diagram and a layout view of an IC 1005a for processing multi-bit signals, according to an exemplary embodiment of the inventive concept. According to an exemplary embodiment of the inventive concept, a unit cell of an IC 1005a may include sub-cells including a plurality of bit circuits. For example, as shown in FIG. 6A, the IC 1005a may include a first sub-cell 1500a, a second sub-cell 1600a, a third sub-cell 1700a, and a fourth sub-cell 1800a. Each of the first through fourth sub-cells 1500a, 1600a, 1700a, and 1800a may receive an N-bit signal and may generate an N-bit output signal. Each of the first through fourth sub-cells 1500a, 1600a, 1700a, and 1800a may process the N-bit signal. For example, the first sub-cell 1500a may include N bit circuits for respectively processing N-bit signals, may receive an N-bit signal A[1:N], and may generate an N-bit output signal B[1:N]. Accordingly, the first through fourth sub-cells 1500a, 1600a, 1700a, and 1800a may receive a 4N-bit signal A[1:4N] in total and may generate a 4N-bit output signal B[1:4N]. The IC 1005a may receive the first voltage VDD1 and the second voltage VDD2.

FIG. 6B is a layout view illustrating the IC 1005a of FIG. 6A that is disposed on the substrate. As shown in FIG. 6B, a unit cell 1005b may include first through fourth layouts 1500b, 1600b, 1700b, and 1800b respectively corresponding to the first through fourth sub-cells 1500a, 1600a, 1700a, and 1800a. According to an exemplary embodiment of the inventive concept, as shown in FIG. 6B, the first through fourth layouts 1500b, 1600b, 1700b, and 1800b may be respectively disposed in four quadrants of the unit cell 1005b. According to an exemplary embodiment of the inventive concept, the first layout 1500b of the first sub-cell 1500a and the second layout 1600b of the second sub-cell 1600a may be symmetrical to each other about an axis that is parallel to the Y-axis and crosses the unit cell 1005b, and the third layout 1700b of the third sub-cell 1700a and the fourth layout 1800b of the fourth sub-cell 1800a may be symmetrical to the first layout 1500b of the first sub-cell 1500a and the second layout 1600b of the second sub-cell 1600a about an axis that is parallel to the X-axis and crosses the unit cell 1005b.

As shown in FIG. 6B, the unit cell 1005b may include a first well 105 that is biased to the first voltage VDD1, and a second well 205 and a third well 305 that are biased to the second voltage VDD2. As shown in FIG. 6B, the first well 105 may be disposed to be spaced apart from boundaries of the unit cell 1005b, and the second well 205 and the third well 305 may be disposed to respectively contact sides that face each other in the X-axis direction from among the boundaries of the unit cell 1005b. The first well 105 may be disposed to be spaced apart by the distance W2W or more from the second well 205 and the third well 305.

According to an exemplary embodiment of the inventive concept, each of the first through fourth sub-cells 1500a, 1600a, 1700a, and 1800a may include at least one transistor from among a plurality of transistors that is disposed in the first well 105. For example, as shown in FIG. 6B, the first through fourth sub-cells 1500a, 1600a, 1700a, and 1800a may respectively include transistors T155, T165, T175, and T185 that are disposed in the first well 105. That is, the first through fourth layouts 1500b, 1600b, 1700b, and 1800b may share the first well 105 that is biased to the first voltage VDD1, instead of the second voltage VDD2 that is supplied to circuits that are disposed adjacent to the unit cell 1005b. Since the first through fourth sub-cells 1500a, 1600a, 1700a, and 1800a for processing N-bit signals are disposed to share the first well 105, an area occupied by the unit cell 1005b may be less than that when the first through fourth sub-cells 1500a, 1600a, 1700a, and 1800a are individually disposed in identical layouts. That is, a length W6 of the unit cell 1005b in the X-axis direction may be less than that when the first through fourth sub-cells 1500a, 1600a, 1700a, and 1800a are individually disposed in identical layouts.

Figure 7A:
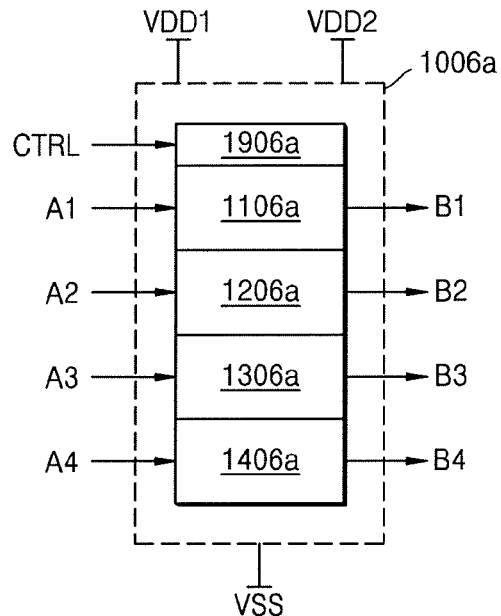
FIGS. 7A and 7B are respectively a block diagram and a layout view of an IC for processing multi-bit signals, according to an exemplary embodiment of the inventive concept.
Figure 7B:
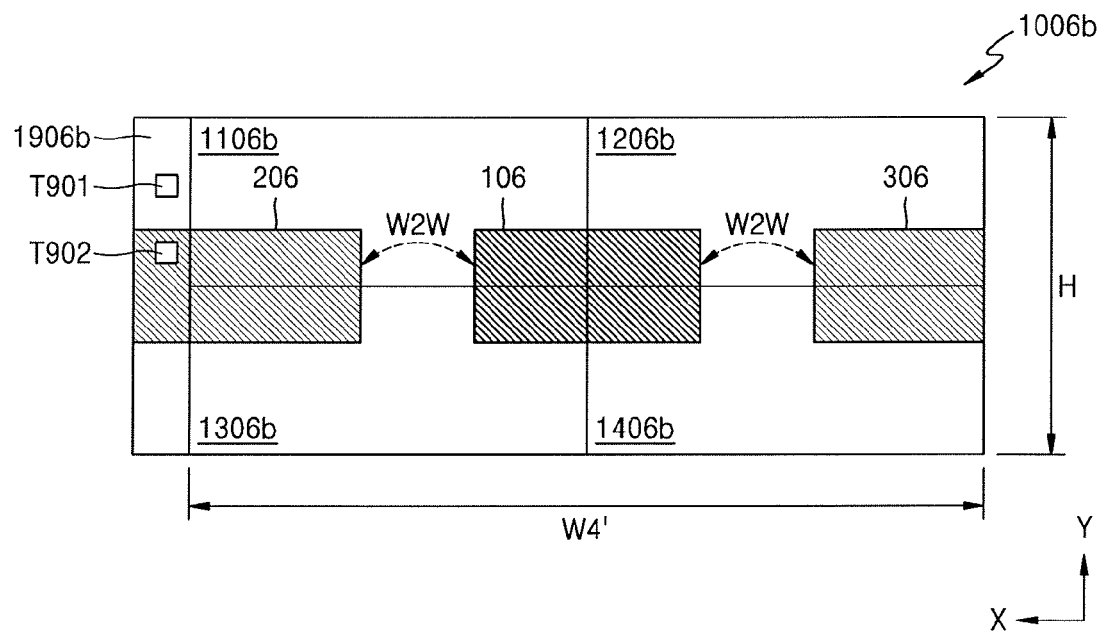

FIGS. 7A and 7B are respectively a block diagram and a layout view of an IC 1006a for processing multi-bit signals, according to an exemplary embodiment of the inventive concept. Referring to FIG. 7A, the IC 1006a may include first through fourth bit circuits 1106a, 1206a, 1306a, and 1406a. The first through fourth bit circuits 1106a, 1206a, 1306a, and 1406a may respectively receive the first through fourth bit signals A1, A2, A3, and A4 and may respectively generate the first through fourth output signals B1, B2, B3, and B4.

According to an exemplary embodiment of the inventive concept, the IC 1006a may include a common circuit 1906a. The common circuit 1906a may be electrically connected to the first through fourth bit circuits 1106a, 1206a, 1306a, and 1406a. The common circuit 1906a may receive the control signal CTRL from the outside of the IC 1006a and may control the first through fourth bit circuits 1106a, 1206a, 1306a, and 1406a according to the control signal CTRL. For example, according to the control signal CTRL, the common circuit 1906a may include a transistor that cuts off current that flows due to the first voltage VDD1 or the second voltage VDD2 to ground VSS through at least one transistor that is included in each of the first through fourth bit circuits 1106a, 1206a, 1306a, and 1406a.

Since the common circuit 1906a includes at least one circuit for controlling the first through fourth bit circuits 1106a, 1206a, 1306a, and 1406a, the number of transistors that are included in the IC 1006a may be less than that when each of the first through fourth bit circuits 1106a, 1206a, 1306a, and 1406a includes the at least one transistor. Accordingly, the IC 1006a may have a reduced area and reduced power consumption.

For example, when each of the first through fourth bit circuits 1106a, 1206a, 1306a, and 1406a of FIG. 7A has the same configuration as that of the level shifter 50 of FIG. 5, the common circuit 1906a may include an inverter INV1 and two transistors N1 and P1, as shown in the level shifter 50 of FIG. 5. Accordingly, in an exemplary embodiment, the common circuit 1906a may include four transistors, and may be electrically connected to the first through fourth bit circuits 1106a, 1206a, 1306a, and 1406a through two lines (e.g., lines that are respectively connected to a drain of an N-type MOSFET and a drain of a P-type MOSFET). As a result, since the first through fourth bit circuits 1106a, 1206a, 1306a, and 1406a share the four transistors, the number of transistors that is reduced may be 12 in the IC 1006a according to an exemplary embodiment.

FIG. 7B is a layout view illustrating the IC 1006a of FIG. 7A that is disposed on the substrate. As shown in FIG. 7B, a unit cell 1006b may include layouts (hereinafter referred to as a first layout 1106b, a second layout 1206b, a third layout 1306b, and a fourth layout 1406b) respectively corresponding to the first through fourth bit circuits 1106a, 1206a, 1306a, and 1406a. Transistors that are included in the first through fourth bit circuits 1106a, 1206a, 1306a, and 1406a may be disposed in the first through fourth layouts 1106b, 1206b, 1306b, and 1406b. Similar to the unit cell 1004b of FIG. 4B, the first through fourth layouts 1106b, 1206b, 1306b, and 1406b of FIG. 7B may be respectively disposed in four quadrants of the unit cell 1006b.

As shown in FIG. 7B, a layout 1906b corresponding to the common circuit 1906a may be disposed on one side of the unit cell 1006b. The layout 1906b corresponding to the common circuit 1906a may be disposed at the same side of the at least one unit cell 1006b that is contacted by the second well 206 (e.g., a portion of the second well 206 may be disposed in the same area as the layout 1906b corresponding to the common circuit 1906a). As described above, since the first through fourth bit circuits 1106a, 1206a, 1306a, and 1406a share the transistors that are included in the common circuit 1906a, an area of the unit cell 1006b may be reduced. That is,
a length W4' of the unit cell 1006b in the X-axis direction may be less than a length of a unit cell when each of the first through fourth bit circuits 1106a, 1206a, 1306a, and 1406a includes the transistors that are included in the common circuit 1906a.

As shown in FIG. 7B, the unit cell 1006b may include a first well 106 that is biased to the first voltage VDD1, and a second well 206 and a third well 306 that are biased to the second voltage VDD2. The first well 106 may be disposed to be spaced apart by the distance W2W or more from the second well 206 and the third well 306. As shown in FIG. 7B, a transistor T901 and a transistor T902 may be disposed in the layout 1906b, and the transistor T902 may be a P-type MOSFET that is disposed in the second well 206.

Although FIGS. 7A and 7B illustrate an IC 1006a and a unit cell 1006B for processing a 4-bit signal, exemplary embodiments of the inventive concept are not limited thereto. For example, an IC including two or more bit circuits may include a common circuit and the common circuit may control the two or more bit circuits.

Figure 8A:
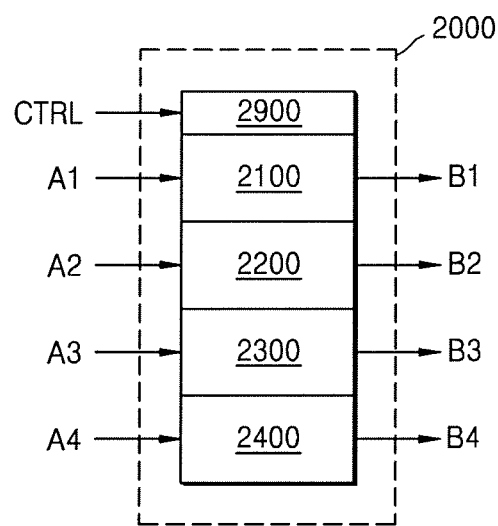
FIGS. 8A and 8B are diagrams illustrating a structure and an operation of an IC for processing multi-bit signals, according to an exemplary embodiment of the inventive concept.
Figure 8B:
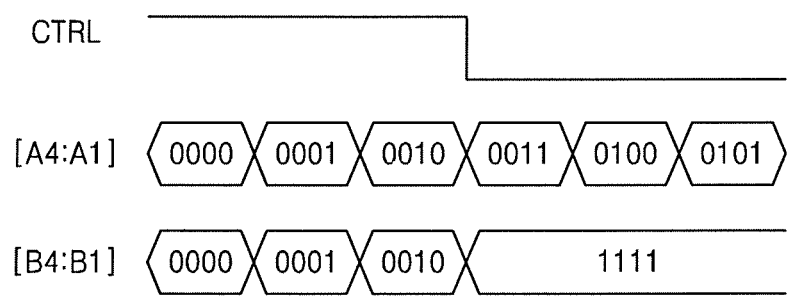

FIGS. 8A and 8B are diagrams illustrating a structure and an operation of an IC 2000 for processing multi-bit signals, according to an exemplary embodiment of the inventive concept. Referring to FIG. 8A, the IC 2000 may include a first bit circuit 2100, a second bit circuit 2200, a third bit circuit 2300, and a fourth bit circuit 2400. The first through fourth bit circuits 2100, 2200, 2300, and 2400 may respectively receive the first through fourth bit signals A1, A2, A3, and A4 and may respectively output the first through fourth output signals B1, B2, B3, and B4. Although the IC 2000 in FIG. 8A is shown as including four bit circuits, exemplary embodiments of the inventive concept are not limited thereto. For example, according to an exemplary embodiment, the IC 2000 may include five or more bit circuits, or may include three or less bit circuits.

Similar to the IC 1006a of FIG. 7A, the IC 2000 of FIG. 8A may include a common circuit 2900. Similar to the unit cell 1006b of FIG. 7B, layouts respectively corresponding to the common circuit 2900 and the first through fourth bit circuits 2100, 2200, 2300, and 2400 may be disposed adjacent to one another on the substrate to form one unit cell.

As shown in FIG. 8A, the common circuit 2900 may receive the control signal CTRL from the outside of the IC 2000, and may control the first through fourth bit circuits 2100, 2200, 2300, and 2400 according to the control signal CTRL. For example, the common circuit 2900 may cut off at least one power supply voltage that is applied to the first through fourth bit circuits 2100, 2200, 2300, and 2400 according to the control signal CTRL or may maintain the first through fourth output signals B1, B2, B3, and B4 that are respectively output from the first through fourth bit circuits 2100, 2200, 2300, and 2400 in specific states including, for example, high-voltage states, low-voltage states, or high-impedance states.

FIG. 8B illustrates an operation performed by the common circuit 2900 to maintain the first through fourth output signals B1, B2, B3, and B4 that are respectively output from the first through fourth bit circuits 2100, 2200, 2300, and 2400 in specific states according to the control signal CTRL. For convenience of explanation, herein, each signal is represented as a binary number and '0' and '1' respectively correspond to a high-voltage state and a low-voltage state. According to an exemplary embodiment of the inventive concept, the IC 2000 may maintain the first through fourth output signals B1, B2, B3, and B4 in specific states even when a power supply voltage that is applied to a first block including the IC 2000 is cut off. The IC 2000 may receive a power supply voltage from the outside of the first block in order to maintain a signal that is output from the IC 2000 in a specific state even when a power supply voltage that is applied to the first block is cut off.

As described above, in order to reduce power consumed by a semiconductor device, an IC that is included in the semiconductor device may be divided into a plurality of blocks to which power is independently supplied, and a power supply voltage that is applied to each of the blocks may be cut off when the block is not used. In order to prevent a second block that receives a signal that is output from the first block from abnormally operating, the signal that is output from the first block or an internal signal may be maintained in a specific state even when a power supply voltage is cut off. As shown in FIG. 8B, in an exemplary embodiment, when the control signal CTRL is in a high-voltage state, an output signal [B4:B1] may have the same value as a bit signal [A4:A1] that is input. When the control signal CTRL is in a low-voltage state, the output signal [B4:B1] may be maintained as '1111' regardless of the value of the input bit signal [A4:A1]. It is to be understood that the operation as shown in FIG. 8B is exemplary, and exemplary embodiments of the inventive concept are not limited thereto.

Figure 9A:
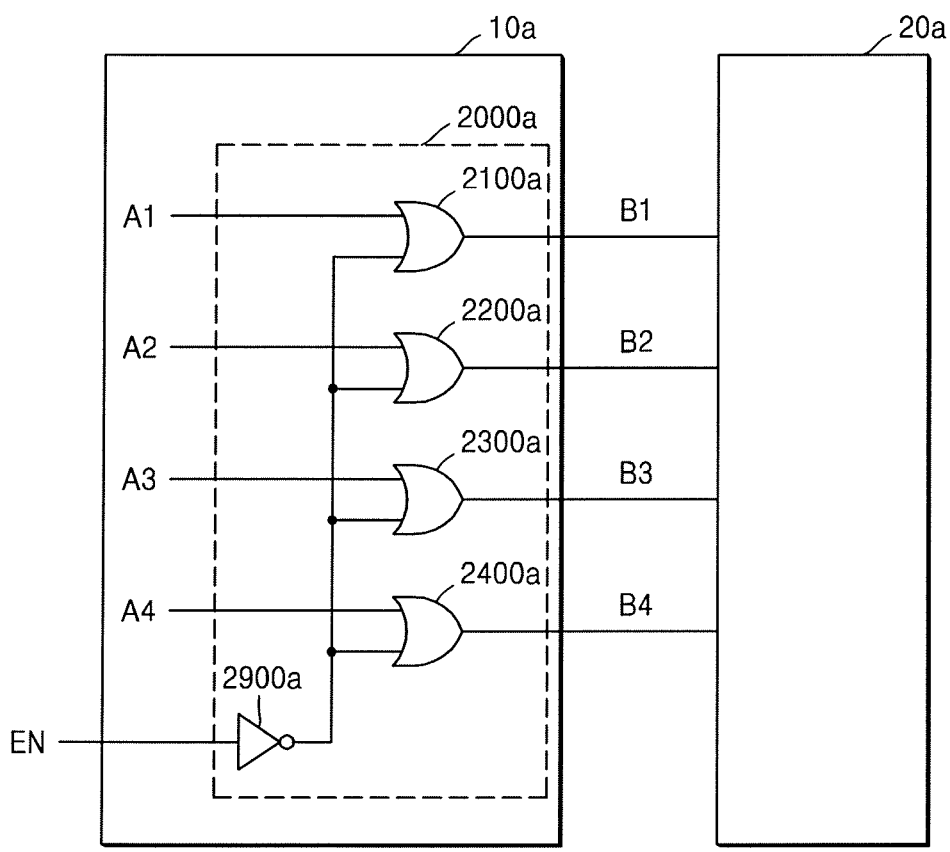
FIGS. 9A through 9C are block diagrams illustrating ICs that include common circuits and are configured to process multi-bit signals, according to exemplary embodiments of the inventive concept.
Figure 9B:
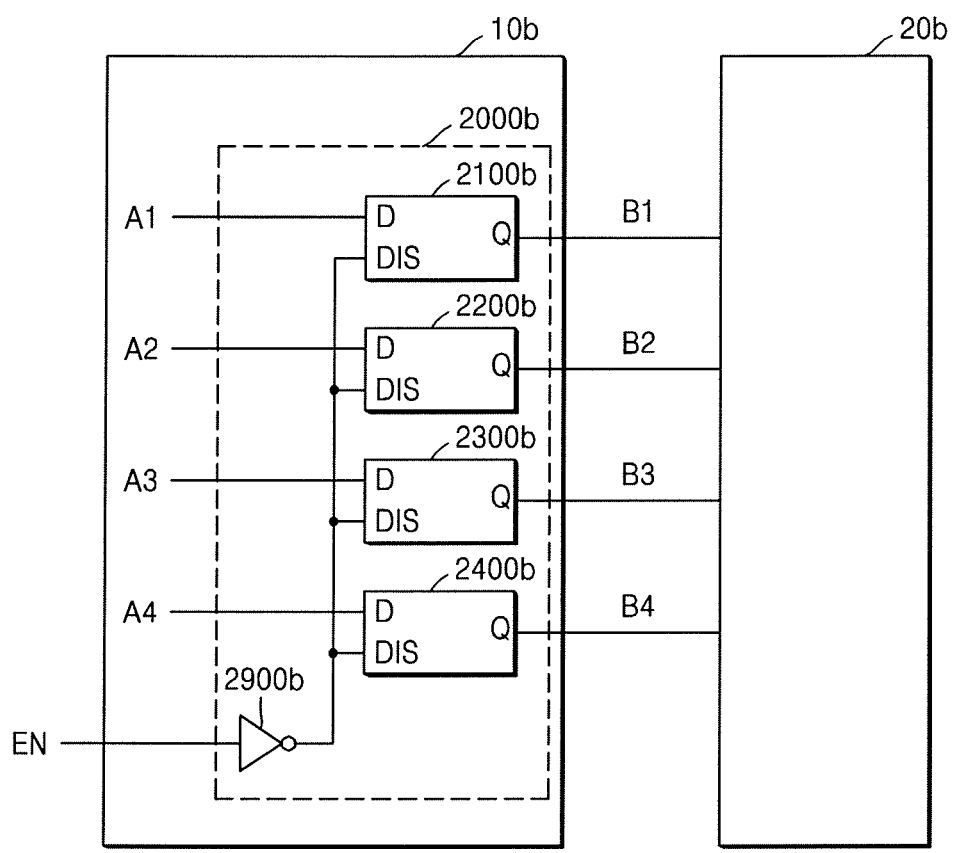
Figure 9C:
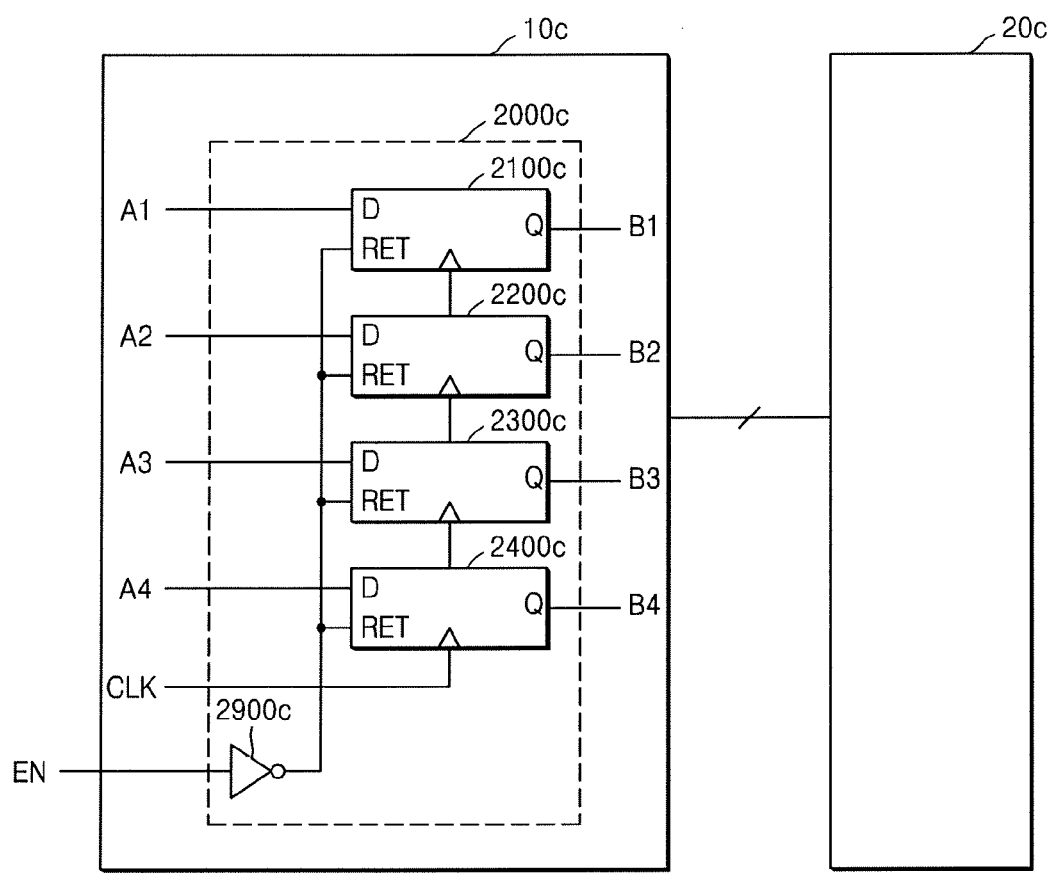

FIGS. 9A through 9C are block diagrams illustrating ICs 2000a, 2000b, and 2000c that include common circuits and are configured to process multi-bit signals, according to exemplary embodiments of the inventive concept. In FIGS. 9A through 9C, a semiconductor device 1a, 1b, or 1c may include a first block 10a, 10b, or 10c and a second block 20a, 20b, or 20c. The first block 10a, 10b, on 10c may receive current due to the first voltage VDD1, and the second block 20a, 20b, or 20e may receive current due to the second voltage VDD2. Alternatively, both the first block 10a, 10b, or 10c and the second block 20a, 20b, or 20c may receive current due to the first voltage VDD1 or the second voltage VDD2. According to an exemplary embodiment of the inventive concept, the first voltage VDD1 and the second voltage VDD2 may have the same voltage level or different voltage levels.

According to an exemplary embodiment of the inventive concept, the IC 2000a, 2000b, or 2000c may include an isolation circuit for maintaining the first through fourth output signals B1, B2, B3, and B4 in specific states even when power supplied to the first block 10a, 10b, or 10c is abnormally reduced, similar to the IC 2000 of FIG. 8A. For example, an enable signal EN that is received from the outside of the first block 10a, 10b, or 10c and is input to the IC 2000a, 2000b, or 2000c may correspond to the control signal CTRL of FIG. 8A and may be used to apply or cut off the first voltage VDD1 to the first block 10a, 10b, or 10c or to apply or cut off a clock signal to the first block 10a, 10b, or 10c. Although the first through fourth output signals B1, B2, B3, and B4 are transmitted to the second block 20a or 20b in FIGS. 9A and 9B and the first through fourth output signals B1, B2, B3, and B4 are transmitted as internal signals of the first block 10c to another IC that is included in the first block 10c in FIG. 9C, the exemplary embodiments are not limited thereto. For example, in FIGS. 9A through 9C, the first through fourth output signals B1, B2, B3, and B4 may be transmitted to the second block 20a, 20b, or 20c, or may be transmitted to another IC that is included in the first block 10a, 10b, or 10c.

According to an exemplary embodiment of the inventive concept, the IC 2000a, 2000b, or 2000c may be connected to a line that may receive current due to a voltage (e.g., the second voltage VDD2) that is applied to the second block 20a, 20b, or 20c in order to maintain the first through fourth output signals B1, B2, B3, and B4 in specific states even when power supplied to the first block 10a, 10b, or 10c is abnormally reduced. The semiconductor devices 1a, 1b, and 1c of FIGS. 9A through 9C may have reduced areas occupied by components and reduced power consumption due to common circuits 2900a, 2900b, and 2900c.

FIG. 9A is a block diagram illustrating the semiconductor device 1a that includes logic gates and is configured to process multi-bit signals, according to an exemplary embodiment of the inventive concept. First through fourth bit circuits 2100a, 2200a, 2300a, and 2400a may respectively include logic gates (e.g., AND, OR, NAND, NOR, XOR, or XNOR gates). For example, as shown in FIG. 9A, each of the first through fourth bit circuits 2100a, 2200a, 2300a, and 2400a may be an OR gate, and the common circuit 2900a may be an inverter. When the enable signal EN is in a high-voltage state (e.g., when the first block 10a normally operates), the common circuit 2900a may transmit a signal that is in a low-voltage state to the first through fourth bit circuits 2100a, 2200a, 2300a, and 2400a. Accordingly, the first through fourth bit circuits 2100a, 2200a, 2300a, and 2400a may generate the first through fourth output signals B1, B2, B3, and B4 respectively corresponding to the first through fourth bit signals A1, A2, A3, and A4.

When the enable signal EN is in a low-voltage state (e.g., when power supplied to the first block 10a is abnormally reduced), the common circuit 2900a may transmit a signal that is in a high-voltage state to the first through fourth bit circuits 2100a, 2200a, 2300a, and 2400a. Accordingly, the first through fourth bit circuits 2100a, 2200a, 2300a, and 2400a may respectively generate the first through fourth output signals B1, B2, B3, and B4 that are in high-voltage states, regardless of the first through fourth bit signals A1, A2, A3, and A4. According to an exemplary embodiment of the inventive concept, when the enable signal EN is maintained in a low-voltage state based on a state (hereinafter referred to as a power-down state) where power supplied to the first block 10a is abnormally reduced, the second block 20a may normally operate even when the first block 10a is in the power-down state.

FIG. 9B is a block diagram illustrating the semiconductor device 1b that includes latches and is configured to process multi-bit signals, according to an exemplary embodiment of the inventive concept. First through fourth bit circuits 2100b, 2200b, 2300b, and 2400b may be latches. When the enable signal EN is in a high-voltage state (e.g., when the first block 10b normally operates), a common circuit 2900b may transmit a signal that is in a low-voltage state to the first through fourth bit circuits 2100b, 2200b, 2300b, and 2400b. The signal that is in the low-voltage state and is output by the common circuit 2900b may be applied to latch disable terminals DIS of the first through fourth bit circuits 2100b, 2200b, 2300b, and 2400b. Accordingly, the first through fourth bit circuits 2100b, 2200b, 2300b, and 2400b may respectively generate the first through fourth output signals B1, B2, B3, and B4 respectively corresponding to the first through fourth bit signals A1, A2, A3, and A4 input via data terminals D of the first through fourth bit circuits 2100b, 2200b, 2300b, and 2400b.

When the enable signal EN is in a low-voltage state (e.g., when the first block 10b is in a power-down state), the common circuit 2900b may transmit a signal that is in a high-voltage state to the latch disable terminals DIS of the first through fourth bit circuits 2100b, 2200b, 2300b, and 2400b. Accordingly, the first through fourth bit circuits 2100b, 2200b, 2300b, and 2400b may generate the first through fourth output signals B1, B2, B3, and B4 whose states are maintained when the enable signal EN is changed from a high-voltage state to a low-voltage state, regardless of the first through fourth bit signals A1, A2, A3, and A4. According to an exemplary embodiment of the inventive concept, when the enable signal EN is changed to a low-voltage state (e.g., when the first block 10b enters the power-down state), the second block 20b may normally operate even when the first block 10b is in the power-down state.

FIG. 9C is a block diagram illustrating the semiconductor device 1c that includes flip-flops and is configured to process multi-bit signals, according to an exemplary embodiment of the inventive concept. The first through fourth bit circuits 2100c, 2200c, 2300c, and 2400c may be flip-flops. When the enable signal EN is in a high-voltage state (e.g., when the first block 10c normally operates), the common circuit 2900c may transmit a signal that is in a low-voltage state to the first through fourth bit circuits 2100c, 2200c, 2300c, and 2400c. The signal that is in the low-voltage state and is output from the common circuit 2900c may be applied to retention enable terminals RET of the first through fourth bit circuits 2100c, 2200c, 2300c, and 2400c. Accordingly, the first through fourth bit circuits 2100c, 2200c, 2300c, and 2400c may respectively generate the first through fourth output signals B1, B2, B3, and B4 respectively corresponding to the first through fourth bit signals A1, A2, A3, and A4 input via data terminal D of the first through fourth bit circuits 2100c, 2200c, 2300c, and 2400c according to a clock signal CLK.

When the enable signal EN is in a low-voltage state (e.g., when the first block 10c is in a power-down state), the common circuit 2900c may transmit a signal that is in a high-voltage state to the retention enable terminals RET of the first through fourth bit circuits 2100c, 2200c, 2300c, and 2400c. Accordingly, the first through fourth bit circuits 2100c, 2200c, 2300c, and 2400c may respectively generate the first through fourth output signals B1, B2, B3, and B4 whose states are maintained when the enable signal EN is changed from a high-voltage state to a low-voltage state, regardless of the first through fourth bit signals A1, A2, A3, and A4. The first through fourth output signals B1, B2, B3, and B4 may be transmitted to another IC that is included in the first block 10c and may be used to maintain a state of the semiconductor device 1c.

Figure 10:
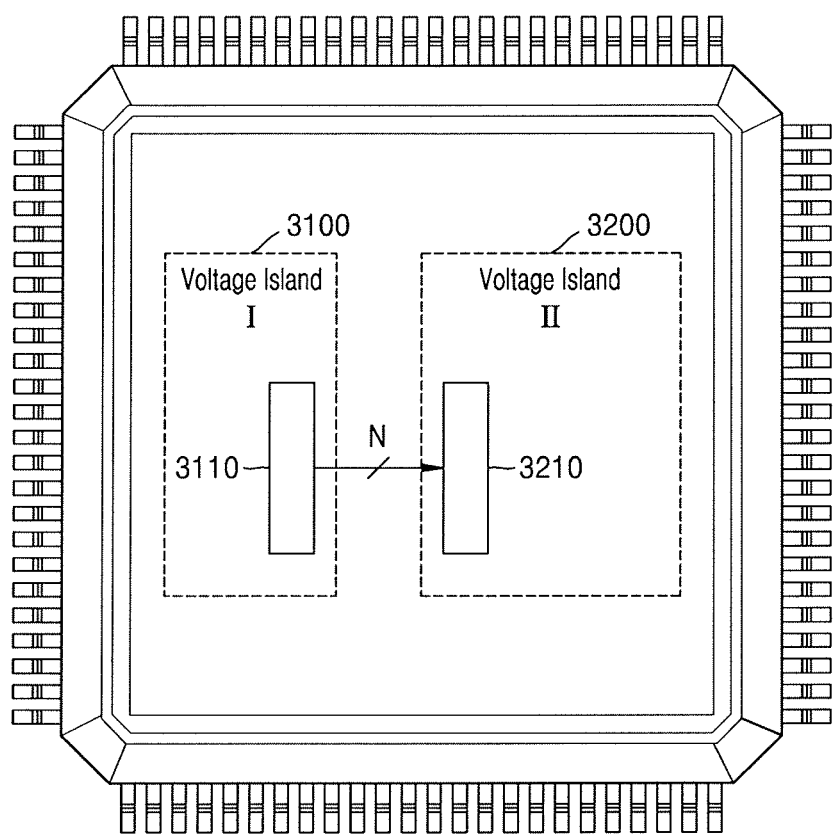
FIG. 10 illustrates a semiconductor device including an IC, according to an exemplary embodiment of the inventive concept.

FIG. 10 illustrates a semiconductor device 3000 including an IC, according to an exemplary embodiment of the inventive concept. As described above, in order to reduce power consumed by the semiconductor device 3000, the IC that is included in the semiconductor device 3000 may be divided into a plurality of blocks to each of which power is independently supplied, and a power supply voltage that is applied each of the blocks may be cut off when the block is not used. Further, voltage levels of power supply voltages that are applied to the blocks may be different from one another according to functions of the blocks. For example, a power supply voltage having a relatively high voltage level may be applied to a block for processing a signal at a high speed. As such, a block to which a power supply voltage is independently applied may be referred to as a voltage island. The following description will be based on the assumption that first and second voltage islands 3100 and 3200 that are included in the semiconductor device 3000 have different voltage levels, however, exemplary embodiments are not limited thereto.

As shown in FIG. 10, the semiconductor device 3000 may include the first voltage island 3100 and the second voltage island 3200. A power supply voltage may be independently applied to each of the first voltage island 3100 and the second voltage island 3200. ICs that are respectively included in the first voltage island 3100 and the second voltage island 3200 may transmit signals through N signal lines. For example, as shown in FIG. 10, the first voltage island 3100 and the second voltage island 3200 may respectively include a first IC 3110 and a second IC 3210, and the first IC 3110 and the second IC 3210 may be connected to each other through the N signal lines.

According to an exemplary embodiment of the inventive concept, the first IC 3110 may include the IC 2000 of FIG. 8A and the second IC 3210 may include the IC 1006a of FIG. 7A. When a power supply voltage is normally applied to the first voltage island 3100, the first IC 3110 may transmit output signals corresponding to bit signals that are received from another IC that is included in the first voltage island 3100 to the second IC 3210 that is included in the second voltage island 3200 through the N signal lines. When the power supply voltage that is applied to the first voltage island 3100 is cut off, the first IC 3110 may maintain the signals that are output through the N signal lines in specific states. The second IC 3210 may receive the signals through the N signal lines from the first IC 3110 that is included in the first voltage island 3100 and may output signals that are obtained by shifting voltage levels of the received signals.

According to exemplary embodiments of the inventive concept, the first and second IC 3110 and 3210 may have reduced areas occupied by components and reduced power consumption. Accordingly, an overhead for connection between the first voltage island 3100 and the second voltage island 3200 may be reduced.

Figure 11:
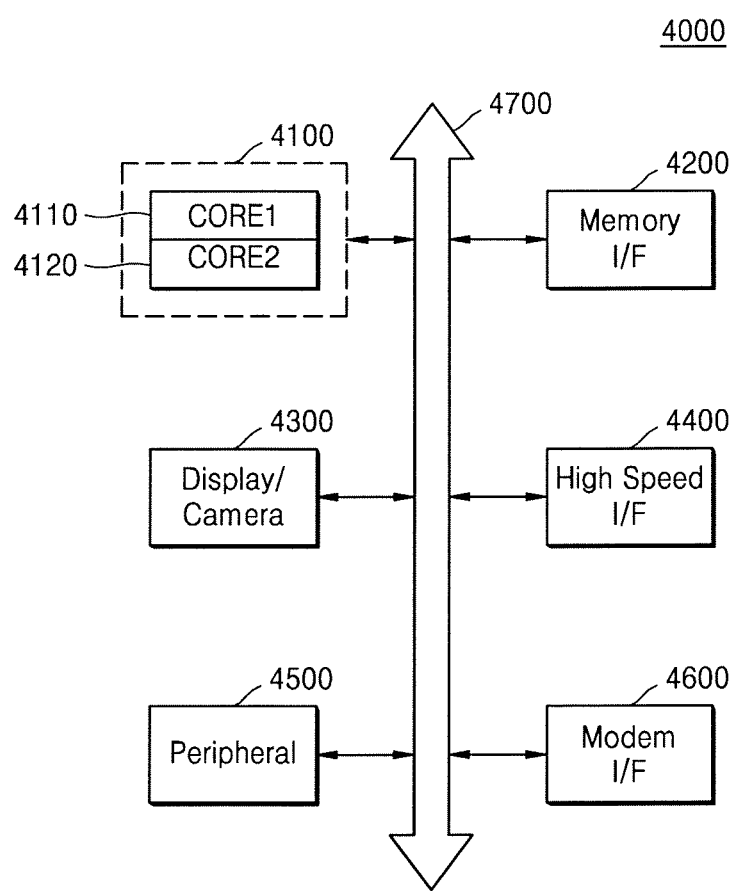
FIG. 11 is a block diagram illustrating a computing system including an IC, according to an exemplary embodiment of the inventive concept.

FIG. 11 is a block diagram illustrating a computing system 4000 including an IC, according to an exemplary embodiment of the inventive concept. The computing system 4000 may include a system whose components are integrated into a single semiconductor chip such as, for example, a system-on-chip (SoC).

The computing system 4000 according to an exemplary embodiment of the inventive concept may include a central processing unit (CPU) 4100, a memory interface block 4200, a display/camera block 4300, a high speed interface block 4400, a peripheral block 4500, and a modem interface block 4600. As shown in FIG. 11, the CPU 4100, the memory interface block 4200, the display/camera block 4300, the high-speed interface block 4400, the peripheral block 4500, and the modem interface block 4600 may be electrically connected to a bus 4700.

The CPU 4100 may control the computing system 4000, and may communicate with other components via the bus 4700. As shown in FIG. 11, the CPU 4100 may include a plurality of cores (e.g., first and second cores 4110 and 4120), and each of the first and second cores 4110 and 4120 may simultaneously perform operations. The memory interface 4200 may communicate with a volatile memory device or a nonvolatile memory device such as, for example, a DDR3 or embedded multimedia card (eMMC) memory device. The memory interface 4200 may write data that is received from the bus 4700 to a memory device or may transmit data that is read from the memory device to other elements via the bus 4700.

The display/camera block 4300 may support, for example, a mobile industry processor interface (MIPI) or a high-definition multimedia interface (HDMI), and may communicate with a display module and a camera module. The display/camera block 4300 may transmit data that is received from the bus 4700 to the display module or may transmit data that is received from the camera module to other elements via the bus 4700. The high speed interface 4400 may support, for example, a universal serial bus (USB) interface, a high speed inter-chip (HSIC) interface, or a serial advanced technology attachment (SATA) interface, and may communicate with devices outside the computing system 4000. The peripheral block 4500 may include a circuit such as, for example, an analog-to-digital converter (ADC) and circuits that support, for example, a universal asynchronous receiver/transmitter (UART) or an inter-IC (I²C) device. Further, the peripheral block 4500 may include circuits such as, for example, a phase-locked loop (PLL) and a timer, for supporting elements that are included in the computing system 4000. The modem interface 4600 may include a circuit that supports, for example, a C2C, an HSIC, an MIPI, or a high-speed synchronous serial interface (HSI), and may transmit data that is received from the bus 4700 to a communication channel that is connected to the modem interface block 4600 or may transmit data that is received from the communication channel to other elements of the computing system 4000 via the bus 4700.

An IC according to any of the exemplary embodiments of the inventive concept described herein may be included in at least one element that is included in the computing system 4000. For example, the CPU 4100 including two cores may enable one core (e.g., the first core 4100 or the second core 4120) that is not used for a specific period to enter a power-down state. For example, the first core 4100 may include the IC 2000a, 2000b, or 2000c of FIG. 9A, 9B, or 9C, and when the first core 4110 is in a power-down state, the IC 2000a, 2000b, or 2000c may prevent another element that is connected to the first core 4110 such as, for example, the second core 4120 or the bus 4700, from abnormally operating.

The first core 4110 may operate at a higher speed than the second core 4120, and as a result, the first core 4110 may receive a higher power supply voltage than that of the second core 4120. For example, the first core 4110 may include the IC 1006a of FIG. 7A, and the IC 1006a may receive bit signals that are received from elements outside the first core 4110 and may generate output signals that are suitable for a power supply voltage of the first core 4110. Since the IC according to an exemplary embodiment of the inventive concept that is included in the first core 4110 or the second core 4120 has a reduced area occupied by components and reduced power consumption, an area occupied by components and power consumption of the CPU 4100 may also be reduced.

Figure 12:
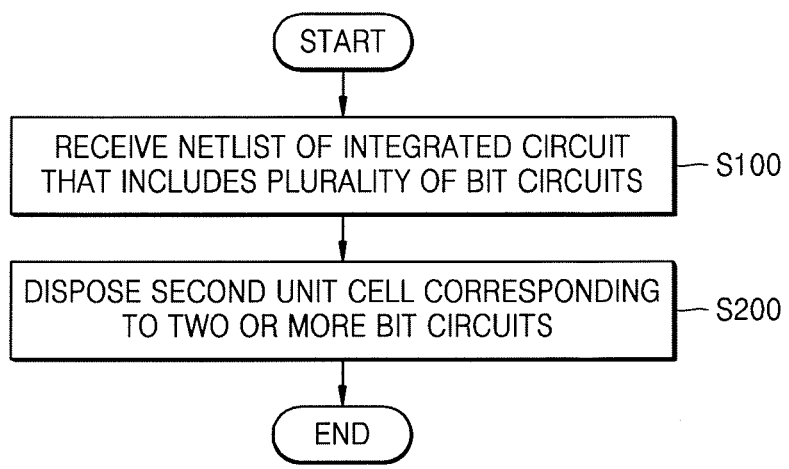
FIG. 12 is a flowchart illustrating a method of generating a layout of an IC, according to an exemplary embodiment of the inventive concept.

FIG. 12 is a flowchart illustrating a method of generating a layout of an IC, according to an exemplary embodiment of the inventive concept. Methods of generating a layout of an IC described with reference to the flowcharts of FIGS. 12 through 15 may be performed by a semiconductor design tool. The semiconductor design tool may be, for example, software including instructions that are executed in a processor. The semiconductor design tool may perform the methods of generating a layout of an IC according to exemplary embodiments of the inventive concept in a computing system including a processor such as, for example, a personal computer (PC) or a server.

As shown in FIG. 12, in operation S100, the semiconductor design tool may receive a netlist of an IC including a plurality of bit circuits. The netlist that defines the IC may include information regarding a plurality of electronic elements that are included in the IC and interconnections between the electronic elements. The semiconductor design tool may generate a layout of the IC based on the netlist of the IC.

The IC that is defined by the netlist that is received by the semiconductor design tool may include the plurality of bit circuits. Each of the bit circuits may be configured to process a single-bit signal and may correspond to a first unit cell on the substrate. For example, referring to FIGS. 2A and 2B, the IC that is defined by the netlist may include the first bit circuit 1101a and the second bit circuit 1201a that have identical elements and identical layouts. The first bit circuit 1101a or the second bit circuit 1201a may correspond to the first or second layout 1101b or 1201b (e.g., the first unit cell).

In operation S200, the semiconductor design tool may dispose a second unit cell corresponding to two or more bit circuits in the layout of the IC. The semiconductor design tool may dispose, in the layout of the IC, the second unit cell having a layout that is different from layouts of two or more first unit cells that are disposed adjacent to each other. For example, referring to FIGS. 2A and 3, the semiconductor design tool may dispose, in the layout of the IC, the unit cell 1003b in which the layout 1103b of the first bit circuit 1101a and the layout 1203b of the second bit circuit 1201a share the first well 103. As described above, the unit cell 1003b may have an area that is less than an area of the unit cell 1101b including the first and second layouts 1101b and 1201b of FIG. 2B. That is, the second unit cell may have an area that is less than a total area of the two or more first unit cells.

According to an exemplary embodiment of the inventive concept, the second unit cell may include a layout corresponding to a common circuit. The common circuit may be configured to receive a control signal and control the two or more bit circuits according to the control signal. For example, referring to FIG. 7B, the semiconductor design tool may dispose the second unit cell such as, for example, the unit cell 1006b in the layout of the IC.

Figure 13:
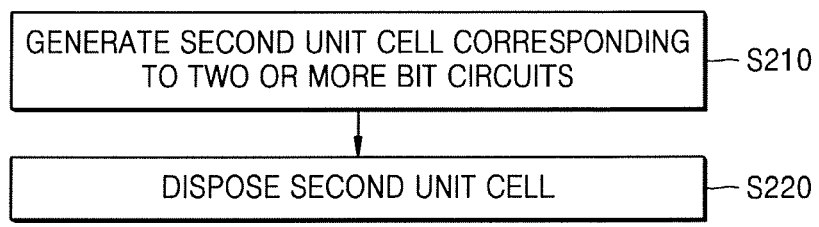
FIG. 13 is a flowchart illustrating an operation of disposing a second unit cell in the method of FIG. 12, according to an exemplary embodiment of the inventive concept.

FIG. 13 is a flowchart illustrating operation S200 (see FIG. 12) of disposing the second unit cell, according to an exemplary embodiment of the inventive concept. According to an exemplary embodiment of the inventive concept, in operation 5210, the semiconductor design tool may generate the second unit cell corresponding to the two or more bit circuits. The semiconductor design tool may generate the second unit cell corresponding to the two or more bit circuits based on each bit circuit. Next, in operation 5220, the semiconductor design tool may dispose the generated second unit cell in the layout of the IC. Operation 5210 performed by the semiconductor design tool to generate the second unit cell will now be described in detail with reference to FIGS. 14A and 14B.

Figure 14A:
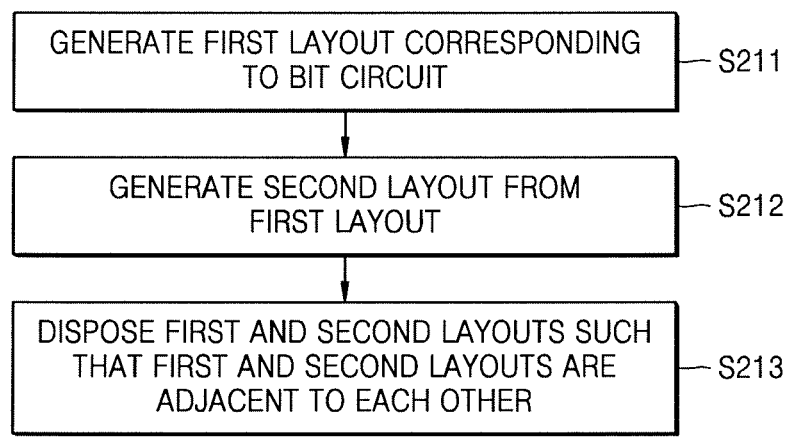
FIGS. 14A and 14B are flowcharts illustrating an operation of generating the second unit cell in the method of FIG. 13, according to an exemplary embodiment of the inventive concept.
Figure 14B:
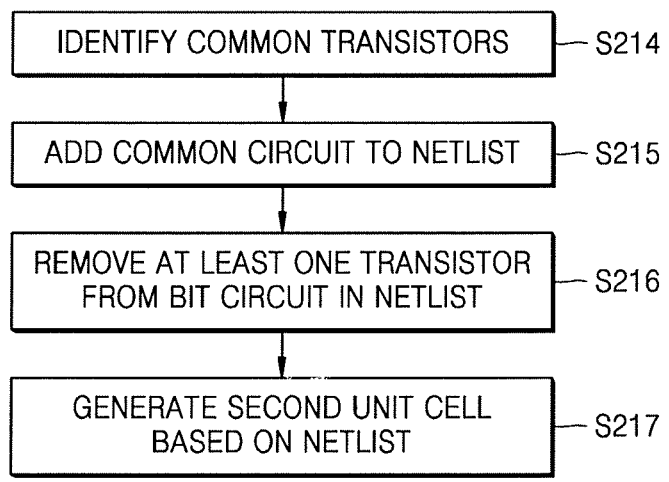

FIGS. 14A and 14B are flowcharts illustrating operation 5210 (see FIG. 13) of generating the second unit cell, according to exemplary embodiments of the inventive concept. In FIG. 14A, the second unit cell is generated based on a layout of each bit circuit. As shown in FIG. 14A, in operation 5211, the semiconductor design tool may generate a first layout corresponding to the bit circuit. The first layout may be the same as or different from a layout of the first unit cell. For example, referring to FIGS. 2A through 3, the semiconductor design tool may generate the first layout 1103b of FIG. 3 as the first layout corresponding to the first bit circuit 1101a. The first layout 1103b of FIG. 3 may be different from the first layout 1101b of FIG. 2B.

In operation S212, the semiconductor design tool may generate a second layout from the first layout. For example, the semiconductor design tool may generate the second layout by symmetrizing or rotating the first layout. In operation S213, the semiconductor design tool may generate the second unit cell by allowing the first layout and the second layout to be disposed adjacent to each other. For example, referring to FIG. 3, the semiconductor design tool may generate the second layout 1203b that is symmetrical to the first layout 1103b about an axis that is parallel to the Y-axis, and may generate the unit cell 1003b by allowing the first and second layouts 1103b and 1203b to be disposed adjacent to each other.

In FIG. 14B, the second unit cell is generated based on common transistors of the bit circuit. As shown in FIG. 14B, in operation S214, the semiconductor design tool may identify the common transistors. The semiconductor design tool may identify the common transistors that are controlled by a control signal that is commonly received by the two or more bit circuits from among a plurality of transistors that is included in the two or more bit circuits. For example, referring to FIG. 5, the semiconductor design tool may identify two transistors that are included in the inverter INV1 and the transistors N1 and P1 as the common transistors from two or more level shifters 50. Next, in operation S215, the semiconductor design tool may generate a common circuit including at least one transistor from among the common transistors and may add the common circuit to the netlist. For example, referring to FIG. 5, the semiconductor design tool may add a common circuit including the inverter INV1 and/or the transistors N1 and P1 to the netlist.

In operation S216, the semiconductor design tool may remove a transistor that is included in the common circuit from each of the two or more bit circuits. Accordingly, each of the two or more bit circuits may include a reduced number of transistors, and thus, the total number of transistors that are included in the IC may be reduced. Next, in operation S217, the semiconductor design tool may generate the second unit cell based on the netlist. For example, the second unit cell may corresponding to a circuit in which at least one transistor from among the transistors that are included in the two or more bit circuits may be shared due to the common circuit.

Figure 15:
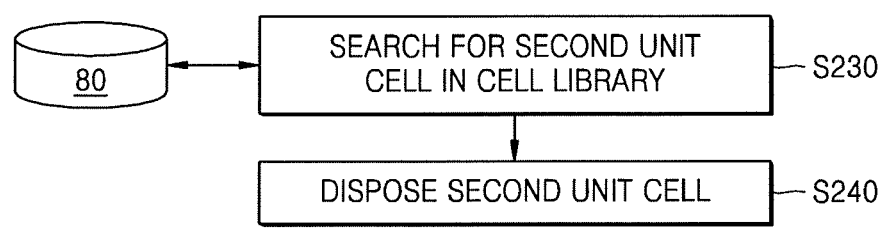
FIG. 15 is a flowchart illustrating an operation of disposing the second unit cell in the method of FIG. 12, according to an exemplary embodiment of the inventive concept.

FIG. 15 is a flowchart illustrating operation S200 (see FIG. 12) of disposing the second unit cell, according to an exemplary embodiment of the inventive concept. According to an exemplary embodiment of the inventive concept, in operation S230, the semiconductor design tool may search for the second unit cell in a cell library to obtain the second unit cell. For example, the semiconductor design tool may search a storage medium 80 in which the cell library is stored for the second unit cell. According to an exemplary embodiment of the inventive concept, the cell library may include the first unit cell and may also include the second unit cell corresponding to a predetermined number of the first unit cells. That is, the cell library that is stored in the storage medium 80 may include the second unit cell that is previously generated, and the semiconductor design tool may obtain the second unit cell by searching the cell library and retrieving the second unit cell from the cell library. Next, in operation S240, the semiconductor design tool may dispose the obtained second unit cell in the layout of the IC.

Figure 16:
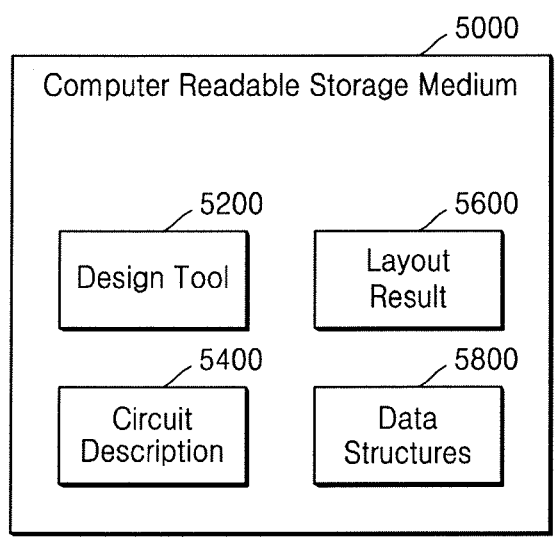
FIG. 16 is a block diagram illustrating a computer-readable storage medium, according to an exemplary embodiment of the inventive concept.

FIG. 16 is a block diagram illustrating a computer-readable storage medium 5000, according to an exemplary embodiment of the inventive concept. The computer-readable storage medium 5000 may include a storage medium that may be read by a computer while the computer-readable storage medium 5000 is used to provide instructions and/or data to the computer. Examples of the computer-readable storage medium 5000 may include, but are not limited to, a magnetic or optical medium such as, for example, a compact disc-read only memory (CD-ROM), a digital versatile disc-ROM (DVD-ROM), a compact disc-recordable (CD-R) medium, a compact disc re-writable (CD-RW) medium, a digital versatile disc-recordable (DVD-R) medium, or a digital versatile disc-rewritable (DVD-RW) medium, a volatile or nonvolatile memory such as, for example, a random-access memory (RAM), a ROM, or a flash memory, a nonvolatile memory that may be accessed, for example, via a USB interface, and a microelectromechanical system (MEMS). The computer-readable storage medium 5000 may be inserted into the computer, integrated into the computer, or may be coupled to the computer via a medium such as, for example, a network and/or a wireless link.

As shown in FIG. 16, the computer-readable storage medium 5000 may include, for example, a design tool 5200, layout result data 5600, a circuit (e.g., IC) description 5400, and data structures 5800. The design tool 5200 that is a semiconductor design tool may include instructions for performing a method of generating a semiconductor layout. For example, the computer-readable storage medium 5000 may store instructions for performing all or some of the operations described with reference to the flowcharts of FIGS. 12 through 15.

The layout result data 5600 may include information regarding sizes and positions of features on a substrate such as, for example, graphic database system information interchange (GDSII) information. The IC description 5400 may include information regarding elements that are included in an IC and interconnections between the elements, (e.g., a netlist). The data structures 5800 may include a data structure(s) that is used to generate a layout of the IC.

Figure 17:
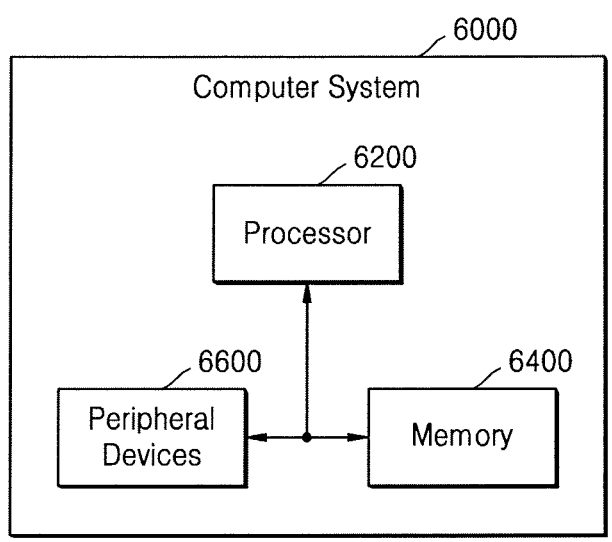
FIG. 17 is a block diagram illustrating a computer system, according to an exemplary embodiment of the inventive concept.

FIG. 17 is a block diagram illustrating a computer system 6000 according to an exemplary embodiment of the inventive concept. As shown in FIG. 17, the computer system 6000 may include, for example, a processor 6200, a memory 6400, and various peripheral devices 6600. The processor 6200 may be connected to the memory 6400 and the peripheral devices 6600.

The processor 6200 may be configured to execute instructions for performing the method described above. According to an exemplary embodiment of the inventive concept, the processor 6200 may execute an instruction set such as, for example, Intel architecture (IA)-32, 64 bit extension IA-32, X86-64, PowerPC, Sparc, microprocessor without interlocked pipeline stage (MIPS), advanced reduced instruction set computer machine (ARM), or IA-64. The computer system 6000 may include one or more processors.

The processor 6200 may be connected to the memory 6400 and the peripheral devices 6600. For example, the processor 6200 may be connected to the memory 6400 and/or the peripheral devices 6600 through various interconnections. Alternatively, one or more bridge chips may generate multiconnections between the processor 6200, the memory 6400, and the peripheral devices 6600 and may be used to connect the components.

The memory 6400 may include, for example, a dynamic random-access memory (DRAM), a double data rate synchronous dynamic random-access memory (DDR SDRAM), or a Rambus DRAM (RDRAM). A memory controller may be provided in order to interface with the memory 6400, and/or the processor 6200 may include the memory controller. The memory 6400 may store the instructions for performing the method of generating the layout of the IC and data that is processed by the processor 6200.

The peripheral devices 6600 may include hardware devices that may be included in the computer system 6000 or may be coupled to the computer system 6000 such as, for example, a storage device and an input/output device (e.g., video hardware, audio hardware, user interface devices, or networking hardware).

While the inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An integrated circuit (IC) comprising at least one unit cell, wherein the at least one unit cell comprises:
 a first bit circuit configured to process a first bit signal;
 a second bit circuit configured to process a second bit signal;
 a first well spaced apart from boundaries of the at least one unit cell and biased to a first voltage;
 a second well biased to a second voltage that is different from the first voltage; and
 a common circuit configured to receive a control signal and control the first and second bit circuits according to the control signal,
 wherein each of the first and second bit circuits comprises at least one transistor from among a plurality of transistors disposed in the first well.

2. The IC of claim 1, wherein the first and second bit circuits have a same configuration.

3. The IC of claim 1, wherein a layout of the first bit circuit and a layout of the second bit circuit are symmetrical to each other about an axis that crosses the at least one unit cell.

4. The IC of claim 1, wherein a layout of the first bit circuit corresponds to a layout of the second bit circuit rotated about a point in the at least one unit cell.

5. The IC of claim 1, wherein each of the first and second bit circuits comprises a level shifter.

6. The IC of claim 1, wherein the at least one unit cell further comprises:
 a third well biased to the second voltage, wherein the second and third wells each contact one side from a pair of sides of the at least one unit cell that face each other, and the pair of sides corresponds to the boundaries of the at least one unit cell.

7. The IC of claim 6, wherein the first well is spaced apart from the second and third wells by at least a minimum distance defined by a well-to-well space rule.

8. The IC of claim 6, wherein the first bit circuit comprises at least one transistor disposed in the second well, and the second bit circuit comprises at least one transistor disposed in the third well.

9. The IC of claim 6, wherein a length of the at least one unit cell in a first direction is equal to an integer number multiplied by a length of a standard cell in the first direction based on a semiconductor manufacturing process of the IC, and the pair of sides are parallel to the first direction.

10. The IC of claim 6, wherein an area of the second well and an area of the third well are determined based on a well proximity effect that occurs in adjacent unit cells contacting the pair of sides.

11. The IC of claim 6, wherein the at least one unit cell further comprises:
 a third bit circuit configured to process a third bit signal; and
 a fourth bit circuit configured to process a fourth bit signal,
 wherein each of the third and fourth bit circuits comprises at least one transistor from among the plurality of transistors disposed in the first well.

12. The IC of claim 11, wherein the third bit circuit further comprises at least one transistor disposed in the second well, and the fourth bit circuit comprises at least one transistor disposed in the third well.

13. The IC of claim 11, wherein layouts of the first through fourth bit circuits are respectively disposed in four quadrants of the at least one unit cell.

14. The IC of claim 1, wherein the common circuit comprises:
 a transistor configured to cut off, according to the control signal, a current that flows due to the first voltage or the second voltage to a ground voltage through at least one transistor disposed in each of the first and second bit circuits.

15. The IC of claim 1, wherein the at least one unit cell comprises:
 a first sub-cell and a second sub-cell, each comprising a plurality of bit circuits,
 wherein the plurality of bit circuits includes the first and second bit circuits, and each of the first and second sub-cells comprises at least one transistor from among the plurality of transistors disposed in the first well.

16. The IC of claim 15, wherein the at least one unit cell comprises:
 a third sub-cell and a fourth sub-cell,
 wherein the third and fourth sub-cells have a same configuration as the first and second sub-cells, and each of the third and fourth sub-cells comprises at least one transistor from among the plurality of transistors disposed in the first well.

17. The IC of claim 16, wherein layouts of the first through fourth sub-cells are respectively disposed in four quadrants of the at least one unit cell.

18. A method of generating a layout of an integrated circuit (IC), comprising:
 receiving a netlist of the IC, wherein the netlist comprises a plurality of bit circuits, and each bit circuit is configured to process a single-bit signal and corresponds to a first unit cell; and
 disposing a second unit cell corresponding to two or more bit circuits in the layout of the IC,
 wherein the plurality of bit circuits included in the IC are configured to simultaneously process a plurality of single-bit signals included in a multi-bit signal,
 wherein the plurality of bit circuits included in the IC are controlled by a common circuit electrically connected to the plurality of bit circuits according to a control signal received by the common circuit.

19. The method of claim 18, wherein the second unit cell comprises a first well spaced apart from boundaries of the second unit cell and biased to a first voltage, and a second well biased to a second voltage that is different from the first voltage,
 wherein each of the two or more bit circuits comprises at least one transistor from among a plurality of transistors disposed in the first well.

* * * * *